US012701716B2

(12) United States Patent
Lee et al.

(10) Patent No.: US 12,701,716 B2
(45) Date of Patent: Aug. 4, 2026

(54) SEMICONDUCTOR DEVICE AND METHOD OF FABRICATING THE SAME

(71) Applicant: Samsung Electronics Co., Ltd., Suwon-si (KR)

(72) Inventors: Kilho Lee, Suwon-si (KR); Daeshik Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 381 days.

(21) Appl. No.: 18/425,147

(22) Filed: Jan. 29, 2024

(65) Prior Publication Data

US 2025/0063739 A1     Feb. 20, 2025

(30) Foreign Application Priority Data

Aug. 16, 2023     (KR) ........................ 10-2023-0106748

(51) Int. Cl.
H10B 61/00          (2023.01)
(52) U.S. Cl.
CPC ................................... H10B 61/00 (2023.02)
(58) Field of Classification Search
CPC ........ H10B 61/00; H10B 63/24; H10B 63/30; H10B 63/80; H10B 61/10; H10N 70/231; H10N 70/826; H10N 50/10; H10N 50/80; G11C 11/02
See application file for complete search history.

(56) References Cited

U.S. PATENT DOCUMENTS

| | | | |
|---|---|---|---|
| 9,698,200 B2 | 7/2017 | Li et al. | |
| 9,865,649 B2 | 1/2018 | Tan et al. | |
| 10,497,749 B2 | 12/2019 | Kang | |
| 10,978,510 B2 | 4/2021 | Li et al. | |
| 10,985,211 B1 | 4/2021 | Lee et al. | |
| 11,043,531 B2 | 6/2021 | Kalnitsky et al. | |
| 11,374,055 B2 | 6/2022 | Tsai et al. | |
| 11,437,432 B2 | 9/2022 | Lee et al. | |
| 11,469,268 B2 | 10/2022 | Lee et al. | |
| 11,469,269 B2 | 10/2022 | Chen et al. | |
| 11,545,523 B2 | 1/2023 | Lin | |
| 2023/0031589 A1 | 2/2023 | Wu et al. | |
| 2023/0247823 A1* | 8/2023 | Cho ................... | H10B 12/0335 257/296 |

* cited by examiner

*Primary Examiner* — Mohammad A Rahman
(74) *Attorney, Agent, or Firm* — Harness, Dickey & Pierce, P.L.C.

(57)          ABSTRACT

A semiconductor device may include a substrate, data storage patterns on the substrate and spaced apart from each other in a first direction and a second direction that intersect each other and are parallel to a top surface of the substrate, first cell conductive lines that extend in the first direction and are spaced apart from each other in the second direction on the data storage patterns, cell via contacts that are spaced apart from each other in the first direction and disposed between a pair of the first cell conductive lines, dummy data storage patterns that are spaced apart from each other in the first direction between the first cell conductive lines and are disposed between the cell via contacts, and upper conductive lines on the cell via contacts and electrically connected to the cell via contacts, respectively.

20 Claims, 29 Drawing Sheets

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2023-0106748, filed on Aug. 16, 2023 in the Korean Intellectual Property Office, the disclosure of which is hereby incorporated by reference in its entirety.

BACKGROUND

Inventive concepts relate to a semiconductor device, and more particularly, to a semiconductor device including a magnetic tunnel junction and/or a method of fabricating the same.

As electronic products trend toward high speed and/or low power consumption, high speed and low operating voltages increasingly may be required for semiconductor memory devices incorporated in the electronic products. Magnetic memory devices have been developed as semiconductor memory devices. Because magnetic memory devices may operate at high speeds and may have nonvolatile characteristics, they have attracted considerable attention as next-generation semiconductor memory devices.

In general, the magnetic memory device may include a magnetic tunnel junction (MTJ). The magnetic tunnel junction may include two magnetic structures and a dielectric layer interposed therebetween. The resistance of the magnetic tunnel junction may vary depending on magnetization directions of the two magnetic structures. For example, the magnetic tunnel junction may have a high resistance when the magnetization directions of the two magnetic structures are anti-parallel and a low resistance when the magnetization directions of the two magnetic structures are parallel. The magnetic memory device may write and read data using the resistance difference between the high and low resistances of the magnetic tunnel junction. With the marked advance in electronic industry, there may have an increasing demand for high integration and/or low power consumption of magnetic memory devices. Accordingly, many studies have been conducted.

SUMMARY

Some embodiments of inventive concepts provide a semiconductor device optimized for high integration.

Some embodiments of inventive concepts provide a semiconductor device whose difficulty of fabrication process is improved and a method of fabricating the same.

Some embodiments of inventive concepts provide a semiconductor device having improved electrical properties and a method of fabricating the same.

According to some embodiments of inventive concepts, a semiconductor device may include a substrate; a plurality of data storage patterns on the substrate and spaced apart from each other in a first direction and a second direction, the first direction and the second direction intersecting each other and being parallel to a top surface of the substrate; a plurality of first cell conductive lines extending in the first direction and being spaced apart from each other in the second direction on the data storage patterns, each of the plurality of first cell conductive lines being connected to a corresponding column of data storage patterns that are spaced apart from each other in the first direction among the plurality of data storage patterns; a plurality of cell via contacts spaced apart from each other in the first direction and disposed between a pair of the plurality of first cell conductive lines; a plurality of dummy data storage patterns spaced apart from each other in the first direction and disposed between the pair of the plurality of first cell conductive lines, the plurality of dummy data storage patterns being interposed between the plurality of cell via contacts; and a plurality of upper conductive lines on the plurality of cell via contacts and electrically connected to the plurality of cell via contacts, respectively.

According to some embodiments of inventive concepts, a semiconductor device may include a substrate; a plurality of data storage patterns on the substrate and spaced apart from each other in a first direction and a second direction, the first direction and the second direction intersecting each other and being parallel to a top surface of the substrate; a plurality of first cell conductive lines extending in the first direction and being spaced apart from each other in the second direction on the data storage patterns, each of the plurality of first cell conductive lines being connected to a corresponding column of data storage patterns that are spaced apart from each other in the first direction among the data storage patterns; a plurality of cell via contacts spaced apart from each other in the first direction and disposed between a pair of the plurality of first cell conductive lines, the plurality of cell via contacts being aligned in the second direction with the corresponding column of data storage patterns; and a plurality of dummy data storage patterns spaced apart from each other in the first direction and disposed between the pair of the plurality of first cell conductive lines, the plurality of dummy data storage patterns being disposed between the plurality of cell via contacts.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

The following will now describe in detail some embodiments of inventive concepts with reference to the accompanying drawings.

Figure 1:
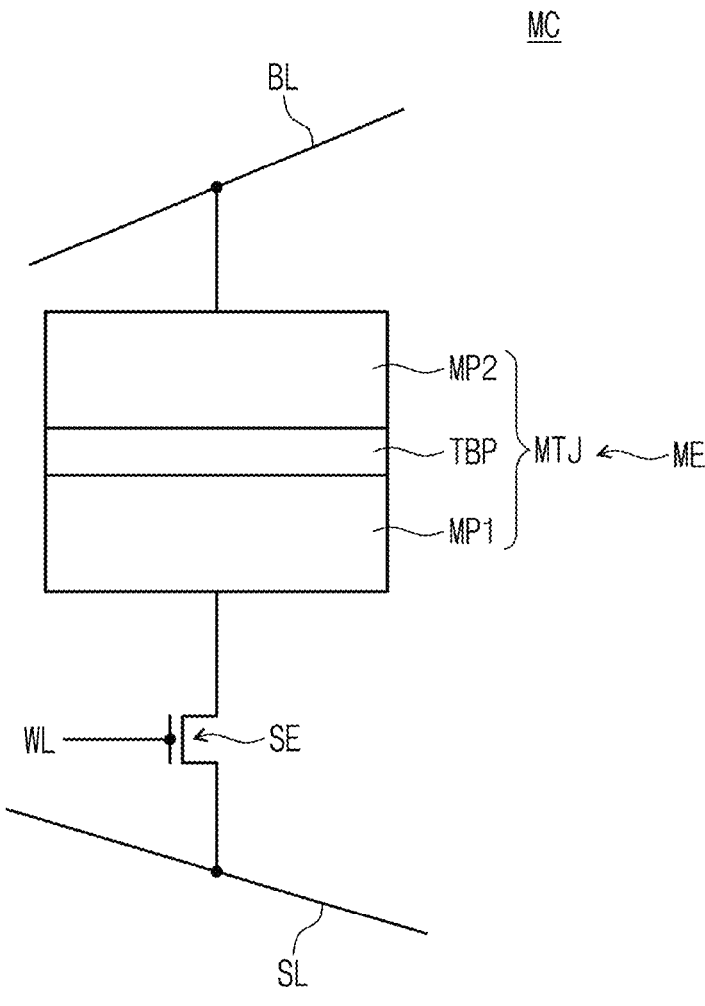
FIG. 1 illustrates a circuit diagram showing a unit memory cell of a semiconductor device according to some embodiments of inventive concepts.

FIG. 1 illustrates a circuit diagram showing a unit memory cell of a semiconductor device according to some embodiments of inventive concepts. Referring to FIG. 1, a unit memory cell MC may include a memory element ME and a selection element SE. The memory element ME and the selection element SE may be electrically connected in series to each other. The memory element ME may be connected between a bit line BL and the selection element SE. The selection element SE may be connected between the memory element ME and a source line SL, and may be controlled by a word line WL. The selection element SE may include, for example, a bipolar transistor or a metal oxide semiconductor (MOS) field effect transistor.

The memory element ME may include a magnetic tunnel junction pattern MTJ including magnetic patterns MP1 and MP2 and a tunnel barrier pattern TBP between the magnetic patterns MP1 and MP2 that are spaced apart from each other. One of the magnetic patterns MP1 and MP2 may be a reference magnetic pattern having a magnetization direction that is fixed regardless of an external magnetic field under a normal use environment. The other of the first and second magnetic patterns MP1 and MP2 may be a free magnetic pattern whose magnetization direction is changed due to an external magnetic field between two stable magnetization directions. The magnetic tunnel junction pattern MTJ may have an electrical resistance whose value is much greater in a case that the magnetization directions of the reference magnetic pattern and the free magnetic pattern are antiparallel to each other than in a case that the magnetization directions of the reference magnetic pattern and the free magnetic pattern are parallel to each other. For example, the electrical resistance of the magnetic tunnel junction pattern MTJ may be controlled by changing the magnetization direction of the free magnetic pattern. The memory element ME may use the difference in electrical resistance dependent on the magnetization directions of the reference magnetic pattern and the free magnetic pattern, which mechanism may cause the unit memory cell MC to store data therein.

Figure 2:
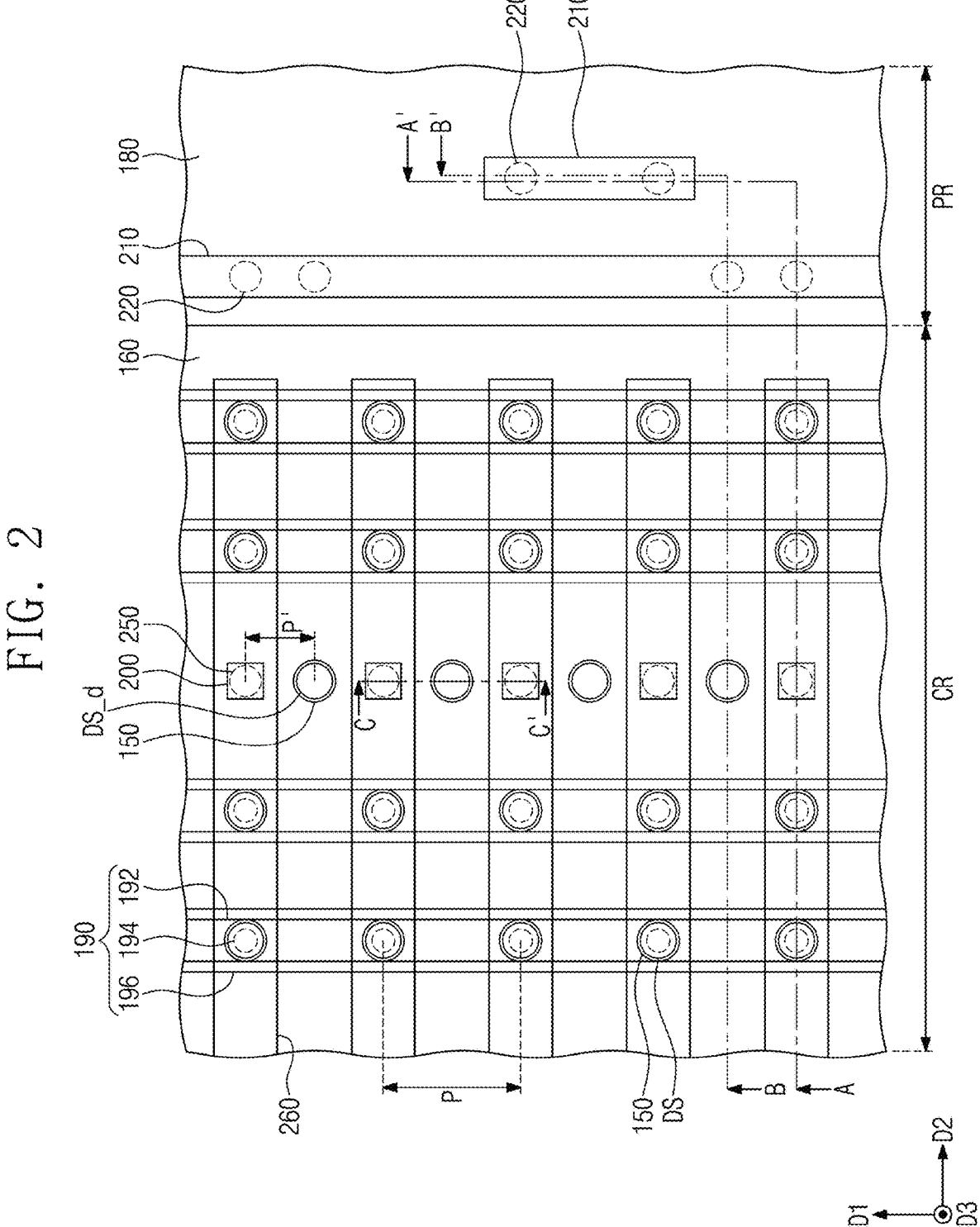
FIG. 2 illustrates a plan view showing a semiconductor device according to some embodiments of inventive concepts.
Figure 3:
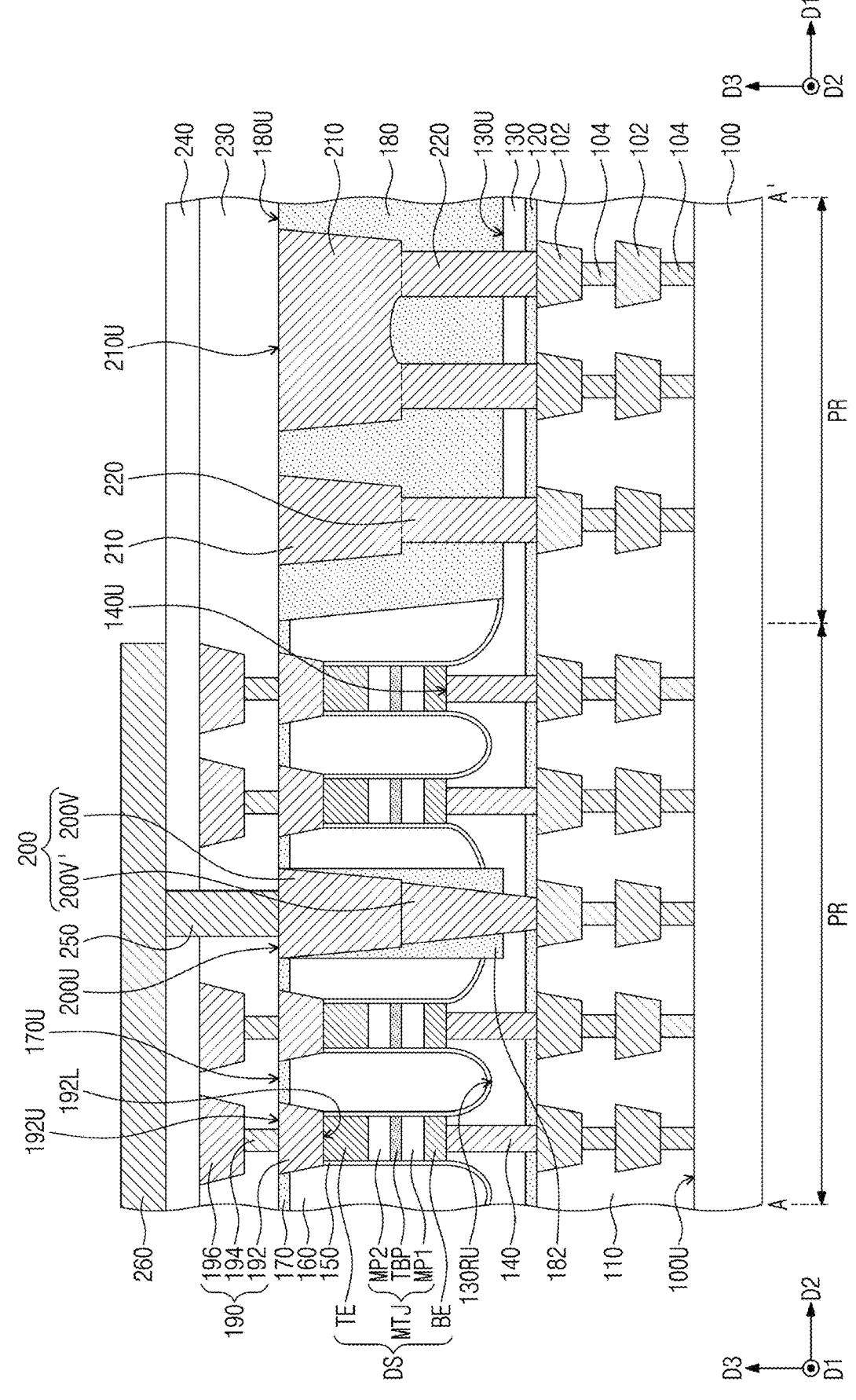
FIG. 3 illustrates a cross-sectional view taken along line A-A' of FIG. 2, showing a semiconductor device according to some embodiments of inventive concepts.
Figure 4:
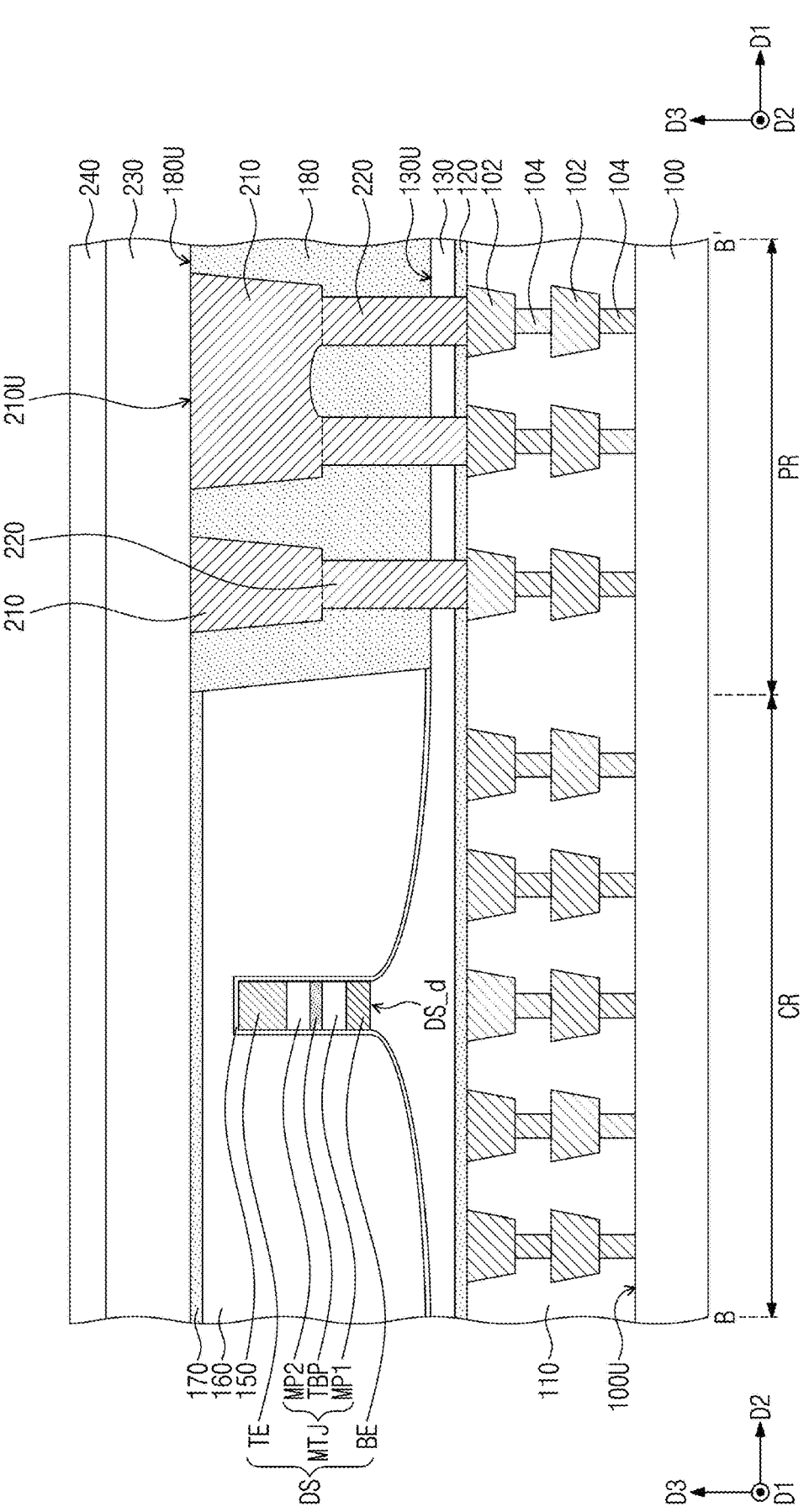
FIG. 4 illustrates a cross-sectional view taken along line B-B' of FIG. 2, showing a semiconductor device according to some embodiments of inventive concepts.
Figure 5:
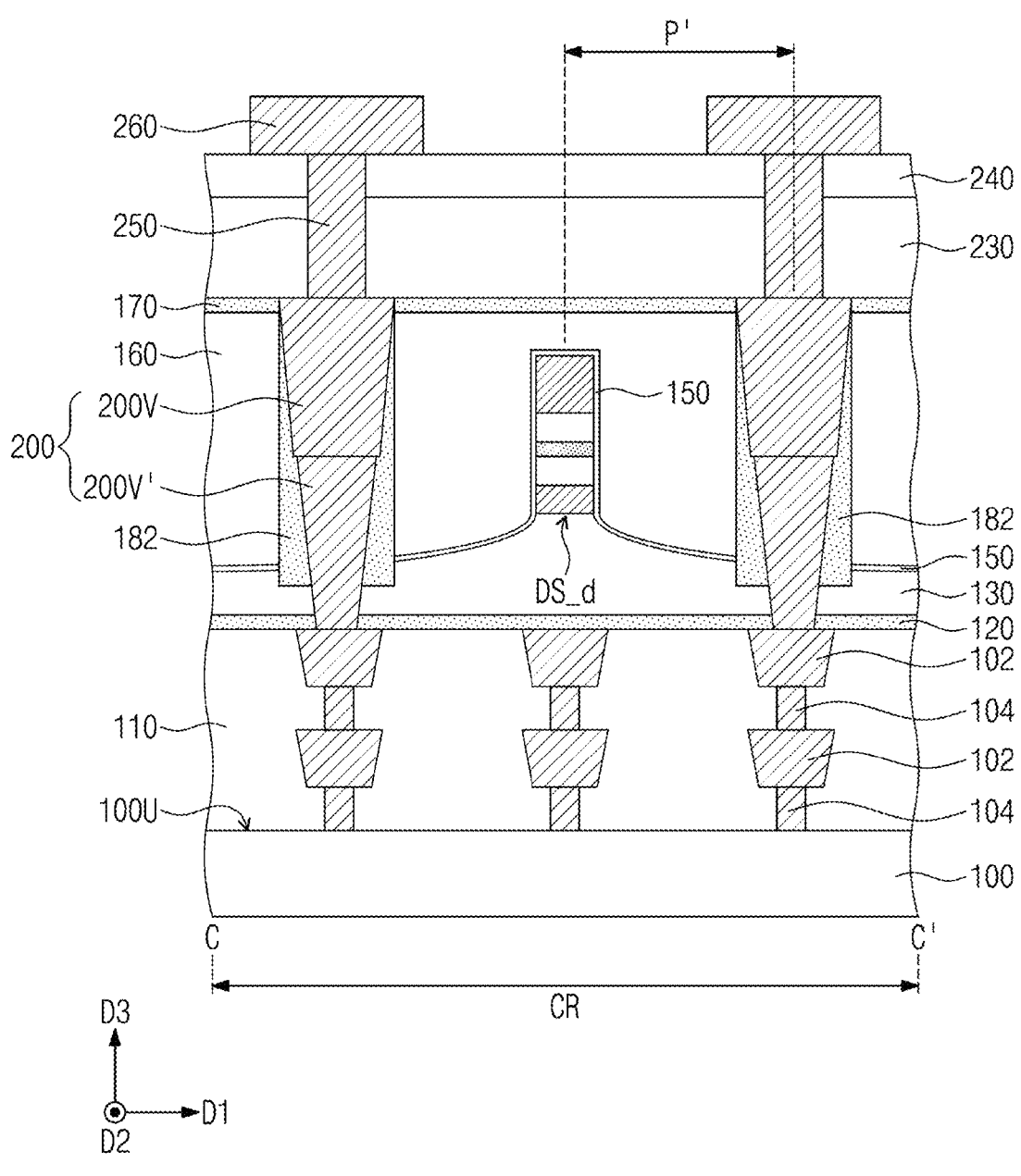
FIG. 5 illustrates a cross-sectional view taken along line C-C' of FIG. 2, showing a semiconductor device according to some embodiments of inventive concepts.
Figure 6A:
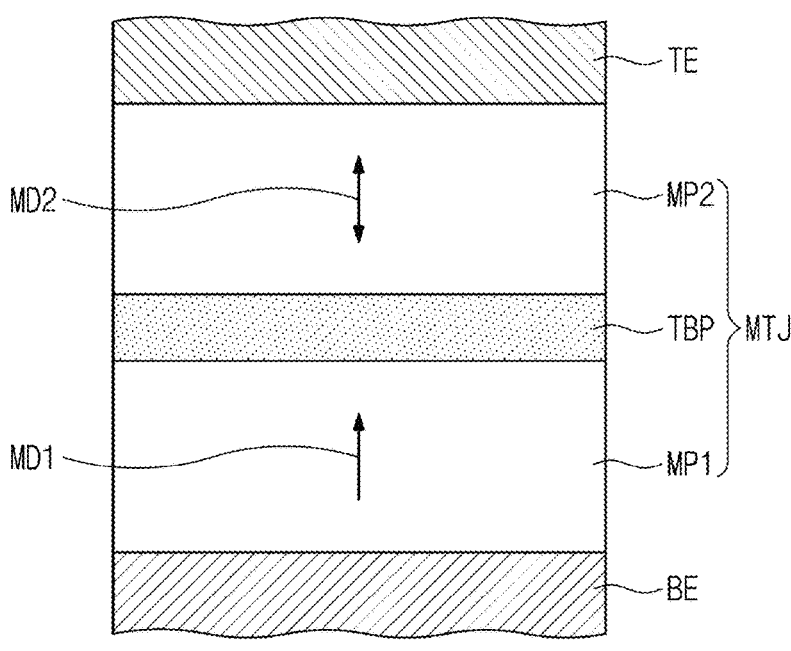
FIGS. 6A and 6B illustrate cross-sectional views showing examples of a magnetic tunnel junction pattern according to some embodiments of inventive concepts.
Figure 6B:
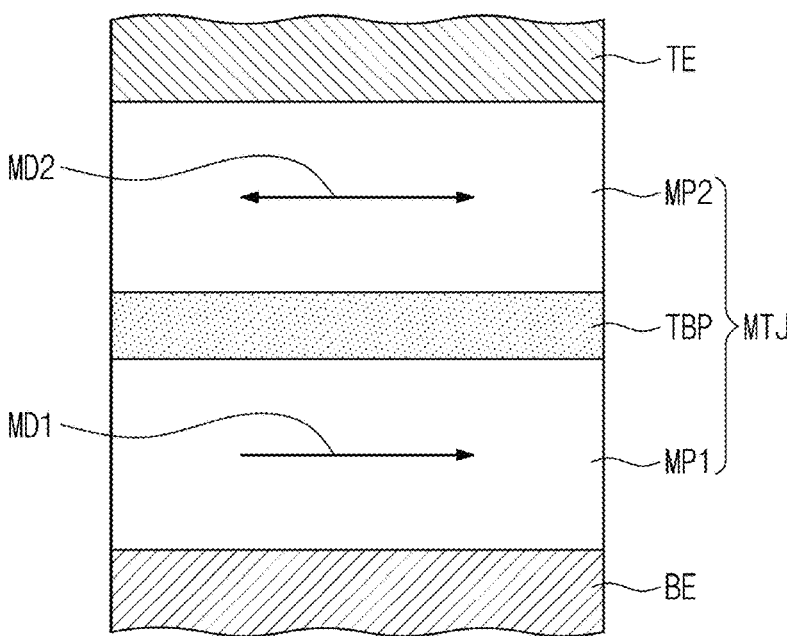

FIG. 2 illustrates a plan view showing a semiconductor device according to some embodiments of inventive concepts. FIG. 3 illustrates a cross-sectional view taken along line A-A' of FIG. 2. FIG. 4 illustrates a cross-sectional view taken along line B-B' of FIG. 2. FIG. 5 illustrates a cross-sectional view taken along line C-C' of FIG. 2. FIGS. 6A and 6B illustrate cross-sectional views showing examples of a magnetic tunnel junction pattern according to some embodiments of inventive concepts.

Referring to FIGS. 2 to 5, a substrate 100 may be provided and may include a cell region CR and a peripheral region PR. The substrate 100 may be a semiconductor substrate including silicon (Si), silicon on insulator (SOI), silicon-germanium (SiGe), germanium (Ge), or gallium-arsenic (GaAs). The cell region CR may be one area of the substrate 100 including the memory cells MC of FIG. 1, and the peripheral region PR may be another area of the substrate 100 including peripheral circuits for driving the memory cells MC.

A wiring structure 102 and 104 may be disposed on the substrate 100. The wiring structure 102 and 104 may be disposed on the cell region CR and the peripheral region PR of the substrate 100. The wiring structure 102 and 104 may include wiring lines 102 vertically spaced apart from the substrate 100 and wiring contacts 104 connected to the wiring lines 102. The wiring lines 102 may be spaced apart from a top surface 100U of the substrate 100 along a direction perpendicular to the top surface 100U of the substrate 100. The wiring contacts 104 may be disposed between the substrate 100 and the wiring lines 102. Each of the wiring lines 102 may be electrically connected to the substrate 100 through a corresponding one of the wiring contacts 104. The wiring lines 102 and the wiring contacts 104 may include metal (e.g., copper).

The selection elements (see SE of FIG. 1) may be disposed on the cell region CR of the substrate 100, and peripheral transistors constituting the peripheral circuits may be disposed on the peripheral region PR of the substrate 100. The selection elements and the peripheral transistors may be, for example, field effect transistors. Each of the wiring lines 102 may be electrically connected through a corresponding one of the wiring contacts 104 to one terminal (e.g., a source terminal, a drain terminal, or a gate terminal) of a corresponding one of either the selection elements or the peripheral transistors.

A wiring dielectric layer 110 may be disposed on the substrate 100 to cover the wiring structure 102 and 104. The wiring dielectric layer 110 may be disposed on the cell region CR of the substrate 100 and may extend onto the peripheral region PR of the substrate 100. The wiring dielectric layer 110 may expose top surfaces of uppermost ones of the wiring lines 102. For example, the wiring dielectric layer 110 may have a top surface substantially coplanar with those of the uppermost wiring lines 102. The wiring dielectric layer 110 may include, for example, one or more of silicon oxide, silicon nitride, and silicon oxynitride.

A first lower dielectric layer 120 may be disposed on the wiring dielectric layer 110 and may cover the exposed top surfaces of the uppermost wiring lines 102. The first lower dielectric layer 120 may be disposed on the wiring dielectric layer 110 on the cell region CR and may extend onto the wiring dielectric layer 110 on the peripheral region PR. The first lower dielectric layer 120 may include, for example, one or more of silicon oxide, silicon nitride, and silicon oxynitride.

A second lower dielectric layer 130 may be disposed on the first lower dielectric layer 120. The second lower dielectric layer 130 may be disposed on the first lower dielectric layer 120 on the cell region CR and may extend onto the first lower dielectric layer 120 on the peripheral region PR. On the cell region CR and the peripheral region PR, the first lower dielectric layer 120 may be interposed between the wiring dielectric layer 110 and the second lower dielectric layer 130. The second lower dielectric layer 130 may include, for example, one or more of silicon oxide, silicon nitride, and silicon oxynitride. The first lower dielectric layer 120 and the second lower dielectric layer 130 may be called a lower dielectric layer.

Data storage patterns DS may be disposed on the second lower dielectric layer 130 on the cell region CR. The data storage patterns DS may be spaced apart from each other in a first direction D1 and a second direction D2 that intersect each other and are parallel to the top surface 100U of the substrate 100, and may be arranged at a first pitch P along the first direction D1. The first pitch P may be defined to indicate a distance between centers of a pair of data storage patterns DS that right next to each other in the first direction D1.

The second lower dielectric layer 130 on the cell region CR may have a top surface 130RU that is recessed toward the substrate 100 between the data storage patterns DS. The second lower dielectric layer 130 on the peripheral region PR may have a top surface 130U located at a height (or level) lower than that of the recessed top surface 130RU of the second lower dielectric layer 130 on the cell region CR. In this description, the term "height" may indicate a distance measured from the top surface 100U of the substrate 100 in a third direction D3 perpendicular to the top surface 100U of the substrate 100.

Lower electrode contacts 140 may be disposed in the second lower dielectric layer 130 on the cell region CR and may be spaced apart from each other in the first direction D1 and the second direction D2. The lower electrode contacts 140 may be disposed below and electrically connected to corresponding ones of the data storage patterns DS. Each of the lower electrode contacts 140 may penetrate the first and second lower dielectric layers 120 and 130 on the cell region CR, and may be connected to a corresponding one of the uppermost wiring lines 102. Each of corresponding data storage patterns DS may be electrically connected to one terminal (e.g., a drain terminal) of a corresponding selection element through a corresponding lower electrode contacts 140 and a corresponding uppermost wiring line 102.

The lower electrode contacts 140 may have top surfaces 140U located at a height higher than that of the recessed top surface 130RU of the second lower dielectric layer 130 on the cell region CR. The lower electrode contacts 140 may include at least one selected from doped semiconductor materials (e.g., doped silicon), metals (e.g., one or more of tungsten, titanium, and tantalum), metal-semiconductor compounds (e.g., metal silicide), and conductive metal nitrides (e.g., one or more of titanium nitride, tantalum nitride, and tungsten nitride).

Each of the data storage patterns DS may include a bottom electrode BE, a magnetic tunnel junction pattern MTJ, and a top electrode TE that are sequentially stacked in the third direction D3 on the second lower dielectric layer 130. The magnetic tunnel junction pattern MTJ may be disposed between the bottom electrode BE and the top electrode TE. The lower electrode contacts 140 may be correspondingly connected to the bottom electrodes BE of the data storage patterns DS. The magnetic tunnel junction pattern MTJ may include a first magnetic pattern MP1, a second magnetic pattern MP2, and a tunnel barrier pattern TBP between the first magnetic pattern MP1 and the second magnetic pattern MP2. The first magnetic pattern MP1 may be disposed between the bottom electrode BE and the tunnel barrier pattern TBP, and the second magnetic pattern MP2 may be disposed between the top electrode TE and the tunnel barrier pattern TBP. The bottom electrode BE may include, for example, conductive metal nitride (e.g., titanium nitride or tantalum nitride). The top electrode TE may include at least one selected from metal (e.g., Ta, W, Ru, or Ir) and conductive metal nitride (e.g., TiN).

The data storage patterns DS may include data storage patterns DS of a first column that are spaced apart from each other in the first direction D1 and data storage patterns DS of a second column that are spaced apart from each other in the first direction D1. The data storage patterns DS of the second column may be spaced apart in the second direction D2 from the data storage patterns DS of the first column.

Dummy data storage patterns DS_d may be disposed between the data storage patterns DS of the first column and the data storage patterns DS of the second column, and may be spaced apart from each other in the first direction D1. The dummy data storage patterns DS_d may be spaced apart in the second direction D2 from the data storage patterns DS of the first column, and the data storage patterns DS of the second column may be spaced apart in the second direction D2 from the dummy data storage patterns DS_d. The dummy data storage patterns DS_d may be disposed offset in the first direction D1 from the data storage patterns DS of the first column and the data storage patterns DS of the second column. The dummy data storage patterns DS_d may not be electrically connected to the lower electrode contacts 140. The dummy data storage patterns DS_d may be configured substantially identically to the data storage patterns DS. Each of the dummy data storage patterns DS_d may include the bottom electrode BE, the top electrode TE, and the magnetic tunnel junction pattern MTJ between the bottom electrode BE and the top electrode TE.

Referring to FIGS. 6A and 6B, the first magnetic pattern MP1 may be a reference layer having a magnetization direction MD1 that is fixed in one direction, and the second magnetic pattern MP2 may be a free layer having a magnetization direction MD2 that can be changed to be parallel or antiparallel to the magnetization direction MD1 of the first magnetic pattern MP1. FIGS. 6A and 6B show an example in which the second magnetic pattern MP2 is a free layer, but inventive concepts are not limited thereto. Differently from that shown in FIGS. 6A and 6B, the first magnetic pattern MP1 may be the free layer and the second magnetic pattern MP2 may be the reference layer.

Referring to FIG. 6A, for example, the magnetization directions MD1 and MD2 of the first and second magnetic patterns MP1 and MP2 may be perpendicular to an interface between the tunnel barrier pattern TBP and the second magnetic pattern MP2. In this case, each of the first and second magnetic patterns MP1 and MP2 may include at least one selected from an intrinsic perpendicular magnetic material and an extrinsic perpendicular magnetic material. The intrinsic perpendicular magnetic material may include a material having a perpendicular magnetization property found even in the absence of an external factor. The intrinsic perpendicular magnetic material may include at least one selected from a perpendicular magnetic material (e.g., CoFeTb, CoFeGd, CoFeDy), a perpendicular magnetic material having an $L1_0$ structure, CoPt of a hexagonal close-packed (HCP) lattice structure, and a perpendicular magnetization structure. The perpendicular magnetic material having the $L1_0$ structure may include at least one selected from FePt of the $L1_0$ structure, FePd of the $L1_0$ structure, CoPd of the $L1_0$ structure, and CoPt of the $L1_0$ structure. The perpendicular magnetic structure may include magnetic layers and non-magnetic layers that are alternately and repeatedly stacked.

For example, the perpendicular magnetic structure may include at least one selected from (Co/Pt)n, (CoFe/Pt)n, (CoFe/Pd)n, (Co/Pd)n, (Co/Ni)n, (CoNi/Pt)n, (CoCr/Pt)n, and (CoCr/Pd) n (where, n is the number of stacked layers). The extrinsic perpendicular magnetic material may include a material having an intrinsic horizontal magnetization property or a perpendicular magnetization property caused by an external factor. For example, the extrinsic perpendicular magnetic material may have a perpendicular magnetization property due to magnetic anisotropy induced by junction between the tunnel barrier pattern TBP and the first magnetic pattern MP1 (or the second magnetic pattern MP2). The extrinsic perpendicular magnetic material may include, for example, CoFeB.

Referring to FIG. 6B, for another example, the magnetization directions MD1 and MD2 of the first and second magnetic patterns MP1 and MP2 may be parallel to an interface between the tunnel barrier pattern TBP and the second magnetic pattern MP2. In this case, each of the first and second magnetic patterns MP1 and MP2 may include a ferromagnetic material. The first magnetic pattern MP1 may further include an antiferromagnetic material for fixing a magnetization direction of the ferromagnetic material in the first magnetic pattern MP1.

Each of the first and second magnetic patterns MP1 and MP2 may include a Heusler alloy including Co. The tunnel barrier pattern TBP may include at least one selected from a magnesium (Mg) oxide layer, a titanium (Ti) oxide layer, an aluminum (Al) oxide layer, a magnesium-zinc (MgZn) oxide layer, and a magnesium-boron (MgB) oxide layer.

Referring back to FIGS. 2 to 5, a capping dielectric layer 150 may be disposed on the second lower dielectric layer 130 on the cell region CR. The capping dielectric layer 150 may conformally cover a lateral surface of each of the data storage patterns DS and the recessed top surface 130RU of the second lower dielectric layer 130 on the cell region CR. When viewed in plan, the capping dielectric layer 150 may surround the lateral surface of each of the data storage patterns DS. The capping dielectric layer 150 may conformally cover lateral surfaces of the bottom electrode BE, the magnetic tunnel junction pattern MTJ, and the top electrode TE. When viewed in plan, the capping dielectric layer 150 may surround the lateral surfaces of the bottom electrode BE, the magnetic tunnel junction pattern MTJ, and the top electrode TE. The capping dielectric layer 150 may include nitride (e.g., silicon nitride).

A cell dielectric layer 160 may be disposed on the second lower dielectric layer 130 on the cell region CR and may cover the data storage patterns DS. The cell dielectric layer 160 may fill a space between the data storage patterns DS. The capping dielectric layer 150 may be interposed between the cell dielectric layer 160 and the lateral surface of each of the data storage patterns DS, and may extend between the cell dielectric layer 160 and the recessed top surface 130RU of the second lower dielectric layer 130 on the cell region CR. The cell dielectric layer 160 may include, for example, one or more of silicon oxide, silicon nitride, and silicon oxynitride. For example, the cell dielectric layer 160 may include tetraethylorthosilicate (TEOS) oxide.

An upper dielectric layer 170 may be disposed on the cell dielectric layer 160 on the cell region CR. The upper dielectric layer 170 may include a material different from that of the cell dielectric layer 160. The upper dielectric layer 170 may include silicon nitride (e.g., SiCN).

A peripheral dielectric layer 180 may be disposed on the second lower dielectric layer 130 on the peripheral region PR. The top surface 130U of the second lower dielectric layer 130 on the peripheral region PR may be located at a height lower than that of the recessed top surface 130RU of the second lower dielectric layer 130 on the cell region CR, and the peripheral dielectric layer 180 may be in contact with the top surface 130U of the second lower dielectric layer 130 on the peripheral region PR. The peripheral dielectric layer 180 may be in contact with a lateral surface 160S of the cell dielectric layer 160 and a lateral surface 170S of the upper dielectric layer 170. A top surface 180U of the peripheral dielectric layer 180 may be located at the same height as that of a top surface 170U of the upper dielectric layer 170. The top surface 180U of the peripheral dielectric layer 180 may be coplanar with the top surface 170U of the upper dielectric layer 170.

The peripheral dielectric layer 180 may include a material different from that of the cell dielectric layer 160. The peripheral dielectric layer 180 may include a dielectric material whose dielectric constant (k) is less than that of the cell dielectric layer 160. The peripheral dielectric layer 180 may include a material different from that of the upper dielectric layer 170, and may include a dielectric material whose dielectric constant (k) is less than that of the upper dielectric layer 170. The peripheral dielectric layer 180 may include, for example, one or more of silicon oxide, silicon nitride, and silicon oxynitride. For example, the peripheral dielectric layer 180 may include a dielectric material, such as porous SiOC, whose dielectric constant (k) is equal to or less than 2.5 or 2.0.

First cell conductive lines 192 may be disposed on the cell region CR. The first cell conductive lines 192 may extend in the first direction D1 and may be spaced apart from each other in the second direction D2. Each of the first cell conductive lines 192 may have a linear shape that extends in the first direction D1. Each of the first cell conductive lines 192 may be electrically connected to corresponding data storage patterns DS that are spaced apart from each other in the first direction D1 among the data storage patterns DS. The data storage patterns DS that are spaced apart from each other in the second direction D2 among the data storage patterns DS may be electrically connected to corresponding first cell conductive lines 192.

Each of the first cell conductive lines 192 may penetrate the upper dielectric layer 170 and an upper portion of the cell dielectric layer 160 to come into connection with the corresponding data storage patterns DS that are spaced apart from each other in the first direction D1. Each of the first cell conductive lines 192 may have a bottom surface 192L in contact with the corresponding data storage patterns DS that are spaced apart from each other in the first direction D1 or with the top surface TE of each of the corresponding data storage patterns DS that are spaced apart from each other in the first direction D1. The first cell conductive lines 192 may include a conductive material, such as metal (e.g., copper).

Cell via contacts 200 may be disposed between the first cell conductive lines 192 on the cell region CR. The cell via contacts 200 may be spaced apart from each other in the first direction D1 between the first cell conductive lines 192. The cell via contacts 200 may be aligned in the second direction D2 with the data storage patterns DS that are arranged in the second direction D2 among the data storage patterns DS.

The dummy data storage patterns DS_d may be interposed between the cell via contacts 200. The cell via contacts 200 and the dummy data storage patterns DS_d may be alternately disposed along the first direction D1 between the first cell conductive lines 192. The cell via contact 200 and the dummy data storage pattern DS_d may be spaced apart at a second pitch P' from each other along the first direction D1. The second pitch P' may be defined to indicate a distance between centers of the cell via contact 200 and the dummy data storage pattern DS_d that right next to in the first direction D1. The second pitch P' may be less than the first pitch P1, for example, about half the first pitch P.

According to inventive concepts, the dummy data storage patterns DS_d may be formed between the cell via contacts 200 and adjacent in the first direction D1 to the cell via contacts 200. It may thus be possible to limit and/or prevent bridge failure in which the cell via contacts 200 are connected to each other. As a result, a semiconductor device may improve in electrical properties.

In addition, as the dummy data storage patterns DS_d are disposed between the cell via contacts 200, it may not be required to additionally form the dummy data storage patterns DS_d on an area adjacent to the cell via contacts 200. There may thus be an increase in integration of the data storage patterns DS disposed on the cell region CR, and as a result, there may be easiness in integration of a semiconductor device.

Each of the cell via contacts 200 may include a first vertical part 200V that extends in the third direction D3 between the data storage patterns DS and a second vertical part 200V' that extends in the third direction D3 below the first vertical part 200V. The second vertical part 200V' may penetrate the first and second lower dielectric layers 120 and 130 on the cell region CR, and may be connected to a correspond one of the uppermost wiring lines 102. Each of the cell via contacts 200 may be electrically connected to one terminal (e.g., a gate terminal) of a corresponding selection element (see SE of FIG. 1) through the corresponding uppermost wiring line 102. The cell via contacts 200 may include the same material as that of the first cell conductive lines 192. The cell via contacts 200 may include a conductive material, such as metal (e.g., copper).

The first vertical part 200V may have a top surface 200U located at the same height as that of top surfaces 192U of the first cell conductive lines 192 and that of the top surface 170U of the upper dielectric layer 170. The top surface 200U of the first vertical part 200V may be coplanar with the top surfaces 192U of the first cell conductive lines 192 and the top surface 170U of the upper dielectric layer 170. The top surface 200U of the first vertical part 200V may be called a top surface of each of the cell via contacts 200.

According to some embodiments, a cell dielectric pattern 182 may be disposed on the cell region CR. The cell dielectric pattern 182 may penetrate the cell dielectric layer 160 and the capping dielectric layer 150 and may extend into the second lower dielectric layer 130. The cell dielectric pattern 182 may include the same material as that of the peripheral dielectric layer 180. The cell dielectric pattern 182 may include a dielectric material whose dielectric constant (k) is less than that of the cell dielectric layer 160. The cell dielectric pattern 182 may include, for example, one or more of silicon oxide, silicon nitride, and silicon oxynitride. For example, the cell dielectric pattern 182 may include a dielectric material, such as porous SiOC, whose dielectric constant (k) is equal to or less than 2.5 or 2.0.

Each of the cell via contacts 200 may penetrate the upper dielectric layer 170, the cell dielectric layer 160, the cell dielectric pattern 182, the second lower dielectric layer 130, and the first lower dielectric layer 120. The first vertical part 200V of each of the cell via contacts 200 may penetrate the upper dielectric layer 170, and may penetrate an upper portion of the cell dielectric layer 160 and an upper portion of the cell dielectric pattern 182. The second vertical part 200V' of each of the cell via contacts 200 may be disposed in the cell dielectric pattern 182. The second vertical part 200V' of each of the cell via contacts 200 may penetrate a lower portion of the cell dielectric pattern 182, the second lower dielectric layer 130, and the first lower dielectric layer 120, and may be connected to the corresponding uppermost wiring line 102.

Peripheral conductive lines 210 may be disposed in the peripheral dielectric layer 180 and on the second lower dielectric layer 130 on the peripheral region PR. The peripheral dielectric layer 180 may cover the peripheral conductive lines 210. The peripheral conductive lines 210 may have top surfaces 210U that are exposed without being covered with the peripheral dielectric layer 180. The top surfaces 210U of the peripheral conductive lines 210 may be coplanar with the top surface 180U of the peripheral dielectric layer 180. The top surfaces 210U of the peripheral conductive lines 210 may be located at the same height as that of the top surface 180U of the peripheral dielectric layer 180. The top surfaces 210U of the peripheral conductive lines 210 may be located at the same height as that of the top surfaces 192U of the first cell conductive lines 192, that of the top surfaces 200U of the cell via contacts 200, and that of the top surface 170U of the upper dielectric layer 170. The top surfaces 210U of the peripheral conductive lines 210 may be coplanar with the top surfaces 192U of the first cell conductive lines 192, the top surfaces 200U of the cell via contacts 200, and the top surface 170U of the upper dielectric layer 170.

Peripheral conductive contacts 220 may be disposed below the peripheral conductive lines 210 on the peripheral region PR. The peripheral conductive contacts 220 may be electrically connected to the peripheral conductive lines 210. Each of the peripheral conductive contacts 220 and its corresponding one of the peripheral conductive lines 210 may be in contact with each other with no interface. Each of the peripheral conductive contacts 220 and its corresponding peripheral conductive line 210 may be connected to constitute a single unitary piece. Each of the peripheral conductive contacts 220 may penetrate a lower portion of the peripheral dielectric layer 180. Each of the peripheral conductive contacts 220 may penetrate the second lower dielectric layer 130 and the first lower dielectric layer 120 on the peripheral region PR, and may be electrically connected to a corresponding one of the uppermost wiring lines 102. Each of the peripheral conductive lines 210 may be electrically connected to one terminal (e.g., a source terminal, a drain terminal, or a gate terminal) of a corresponding peripheral transistor through a corresponding peripheral conductive contact 220 and a corresponding uppermost wiring line 102.

The peripheral conductive lines 210 and the peripheral conductive contacts 220 may include a conductive material, such as metal (e.g., copper). The first cell conductive lines 192, the cell via contacts 200, the peripheral conductive lines 210, and the peripheral conductive contacts 220 may include the same material.

A first interlayer dielectric layer 230 may be disposed on the cell region CR and the peripheral region PR, and may cover the top surface 170U of the upper dielectric layer 170, the top surfaces 192U of the first cell conductive lines 192, the top surfaces 200U of the cell via contacts 200, the top surface 180U of the peripheral dielectric layer 180, and the top surfaces 210U of the peripheral conductive lines 210. The first interlayer dielectric layer 230 may include, for example, one or more of silicon oxide, silicon nitride, and silicon oxynitride.

Second cell conductive lines 196 may be disposed in the first interlayer dielectric layer 230 on the cell region CR. The second cell conductive lines 196 may extend in the first direction D1 and may be spaced apart from each other in the second direction D2. The second cell conductive lines 196 may correspondingly overlap vertically (e.g., in the third direction D3) with the first cell conductive lines 192. First conductive contacts 194 may be disposed in the first interlayer dielectric layer 230 on the cell region CR and may be placed between the first cell conductive lines 192 and the second cell conductive lines 196. The first cell conductive lines 192 may be electrically connected to corresponding second cell conductive lines 196 through corresponding ones of the first conductive contacts 194. A bit line 190 (see BL of FIG. 1) may be constituted by the first cell conductive line 192, the corresponding first conductive contact 194, and the corresponding second cell conductive line 196. The first conductive contacts 194 and the second cell conductive lines 196 may include a conductive material, such as metal (e.g., copper).

A second interlayer dielectric layer 240 may be disposed on the cell region CR and the peripheral region PR, and may cover top surfaces of the second cell conductive lines 196. The second interlayer dielectric layer 240 may include, for example, one or more of silicon oxide, silicon nitride, and silicon oxynitride.

Upper conductive lines 260 may be disposed on the second interlayer dielectric layer 240 on the cell region CR. The upper conductive lines 260 may extend in the second direction D2 and may be spaced apart from each other in the first direction D1. The upper conductive lines 260 may run across the first and second cell conductive lines 192 and 196, and may be located at a height higher than that of the first and second cell conductive lines 192 and 196. Second conductive contacts 250 may be correspondingly disposed on the cell via contacts 200 and may be spaced apart from each other in the first direction D1. The second conductive contacts 250 may be correspondingly connected to the upper conductive lines 260. Each of the upper conductive lines 260 may be electrically connected through a corresponding second conductive contact 250 to a corresponding cell via contact 200. Each of the upper conductive lines 260 may serve as the word line WL of FIG. 1. The upper conductive lines 260 and the second conductive contacts 250 may include a conductive material, such as metal (e.g., copper).

In addition, the cell via contacts 200 may electrically connect the upper conductive lines 260 to the wiring lines 102 in the wiring structure 102 and 104. The upper conductive lines 260 may have a line-width (or, thickness or size) greater than that of the wiring lines 102 in the wiring structure 102 and 104, and thus may have a relatively small resistance. Each of the upper conductive lines 260 may serve as the word line WL of FIG. 1, and there may thus be a reduction in resistance of the word line WL included in the memory cell MC of FIG. 1. Accordingly, it may be possible to provide a semiconductor device with improved electrical properties.

FIGS. 7A to 10B illustrate cross-sectional views showing a method of fabricating a semiconductor device according to some embodiments of inventive concepts. In detail, FIGS. 7A, 8A, 9A, and 10A illustrate cross-sectional views taken along line A-A' of FIG. 2, showing a method of fabricating a semiconductor device according to some embodiments of inventive concepts. FIGS. 7B, 8B, 9B, and 10B illustrate cross-sectional views taken along line C-C' of FIG. 2, showing a method of fabricating a semiconductor device according to some embodiments of inventive concepts. For brevity of description, omission will be made to avoid a duplicate explanation of the semiconductor device discussed with reference to FIGS. 2 to 5, 6A, and 6B.

Figure 7A:
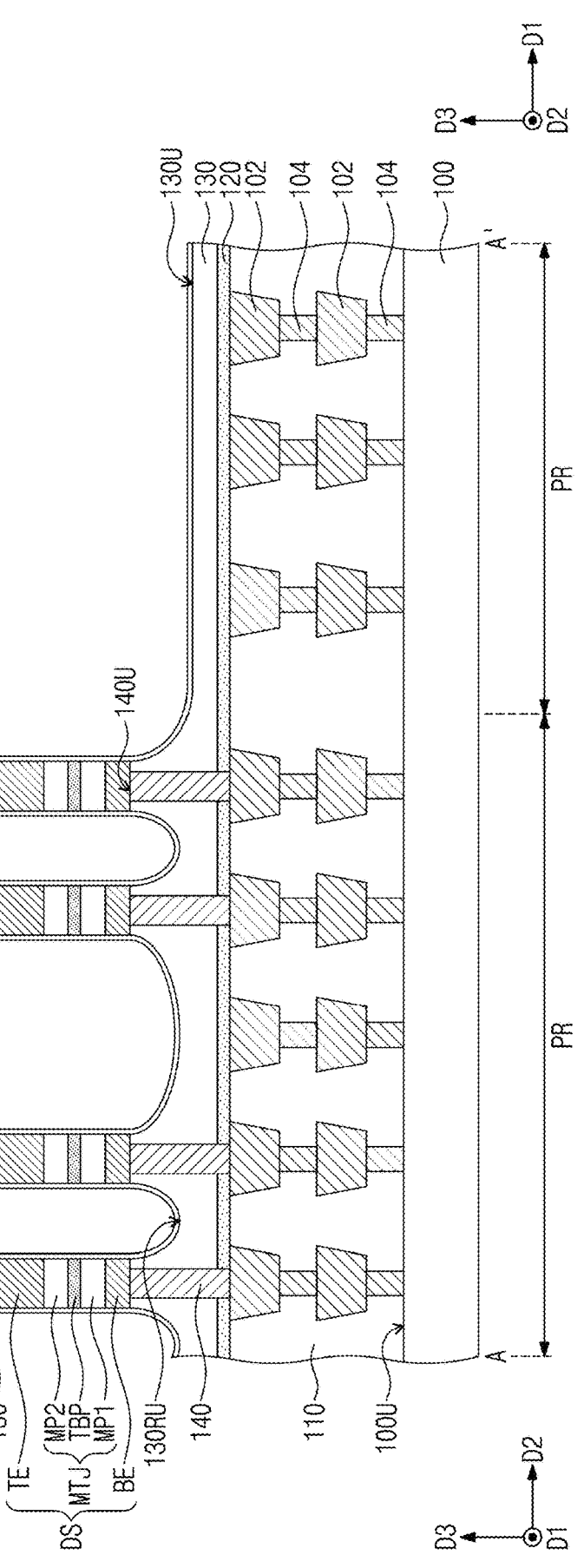
FIGS. 7A, 8A, 9A, and 10A illustrate cross-sectional views taken along line A-A' of FIG. 2, showing a method of fabricating a semiconductor device according to some embodiments of inventive concepts.
Figure 7B:
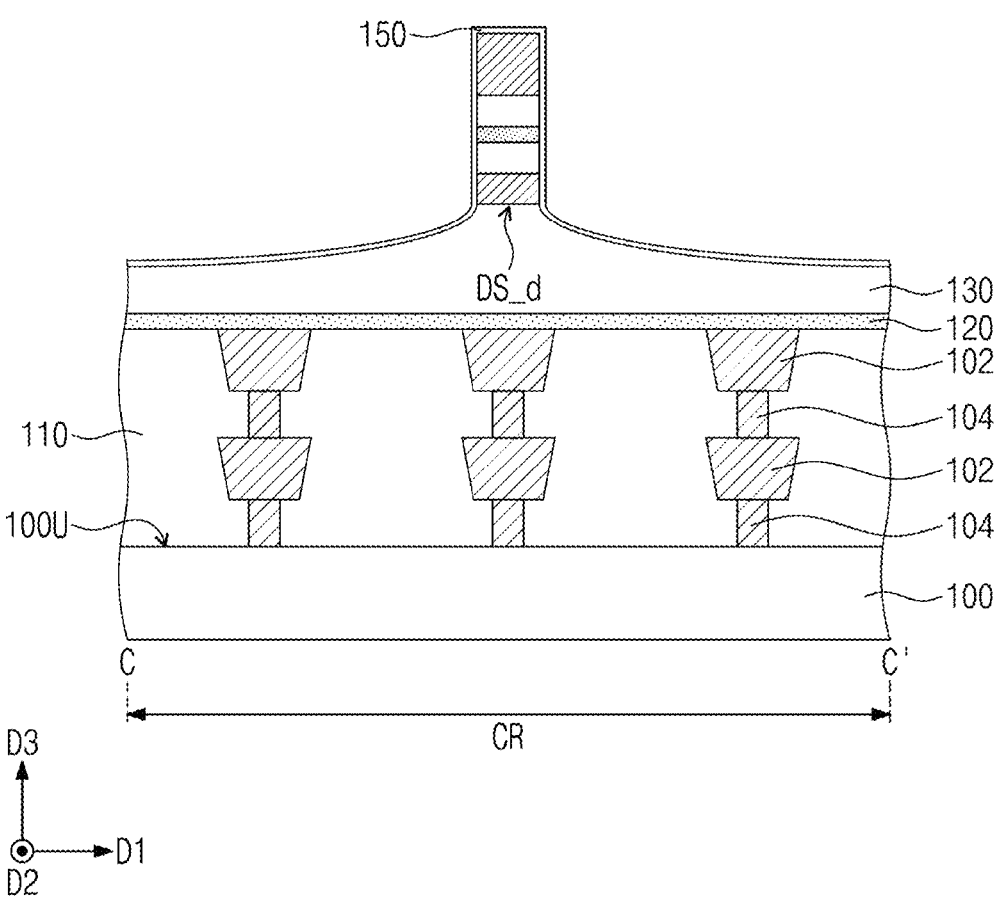
FIGS. 7B, 8B, 9B, and 10B illustrate cross-sectional views taken along line C-C' of FIG. 2, showing a method of fabricating a semiconductor device according to some embodiments of inventive concepts.

Referring to FIGS. 2, 7A, and 7B, a substrate 100 may be provided which includes a cell region CR and a peripheral region PR. Selection elements (see SE of FIG. 1) and peripheral transistors may be formed on the substrate 100, and a wiring structure 102 and 104 may be formed on the selection elements and the peripheral transistors. The wiring structure 102 and 104 may include wiring lines 102 that are spaced apart vertically (e.g., in a third direction D3) from the substrate 100, and may also include wiring contacts 104 connected to the wiring lines 102. Each of the wiring lines 102 may be electrically connected through a corresponding one of the wiring contacts 104 to one terminal (e.g., a source terminal, a drain terminal, or a gate terminal) of a corresponding one of either the selection elements or the peripheral transistors.

A wiring dielectric layer 110 may be formed on the substrate 100, and may cover the wiring structure 102 and 104. The wiring dielectric layer 110 may expose top surfaces of uppermost ones of the wiring lines 102.

A first lower dielectric layer 120 may be formed on the wiring dielectric layer 110, and may cover the exposed top surfaces of the uppermost wiring lines 102. The first lower dielectric layer 120 may be formed on the wiring dielectric layer 110 on the cell region CR, and may extend onto the wiring dielectric layer 110 on the peripheral region PR.

A second lower dielectric layer 130 may be formed on the first lower dielectric layer 120. The second lower dielectric layer 130 may be formed on the first lower dielectric layer 120 on the cell region CR, and may extend onto the first lower dielectric layer 120 on the peripheral region PR.

Lower electrode contacts 140 may be formed in the second lower dielectric layer 130 on the cell region CR. Each of the lower electrode contacts 140 may penetrate the first and second lower dielectric layers 120 and 130 on the cell region CR, and may be electrically connected to one of the uppermost wiring lines 102. The formation of the lower electrode contacts 140 may include, for example, forming lower contact holes that penetrate the first and second lower dielectric layers 120 and 130 on the cell region CR, forming on the second lower dielectric layer 130 a lower contact layer that fills the lower contact holes, and planarizing the lower contact layer until a top surface of the second lower dielectric layer 130 is exposed. In the planarization process, the lower electrode contacts 140 may be locally formed in corresponding lower contact holes.

Data storage patterns DS may be formed on the second lower dielectric layer 130 on the cell region CR. The lower electrode contacts 140 may be disposed below and electrically connected to corresponding ones of the data storage patterns DS. Dummy storage patterns DS_d that are not connected to the lower electrode contacts 140 may be formed by a method the same as or substantially the same as that used for forming the data storage patterns DS.

Each of the data storage patterns DS may include a bottom electrode BE, a magnetic tunnel junction pattern MTJ, and a top electrode TE that are sequentially stacked on the second lower dielectric layer 130. The magnetic tunnel junction pattern MTJ may include a first magnetic pattern MP1, a second magnetic pattern MP2, and a tunnel barrier pattern TBP between the first magnetic pattern MP1 and the second magnetic pattern MP2. The first magnetic pattern MP1 may be disposed between the bottom electrode BE and the tunnel barrier pattern TBP, and the second magnetic pattern MP2 may be disposed between the top electrode TE and the tunnel barrier pattern TBP. The formation of the data storage patterns DS may include, for example, sequentially forming a bottom electrode layer and a magnetic tunnel junction layer on the second lower dielectric layer 130, forming conductive mask patterns on the magnetic tunnel junction layer, and using the conductive mask patterns as an etching mask to sequentially etch the magnetic tunnel junction layer and the bottom electrode layer.

The magnetic tunnel junction layer may include a first magnetic layer, a tunnel barrier layer, and a second magnetic layer that are sequentially stacked on the bottom electrode layer. The magnetic tunnel junction layer and the bottom electrode layer may be formed by, for example, a sputtering process, a chemical vapor deposition process, or an atomic layer deposition process. A mask layer may be patterned to form the conductive mask patterns for forming the data storage patterns DS. The mask layer may include a top electrode layer and a hardmask layer that are sequentially stacked. The hardmask layer may be formed of, for example, one or more of a silicon oxide layer, a silicon nitride layer, and a silicon oxynitride layer.

The magnetic tunnel junction layer and the bottom electrode layer may be etched to respectively form the magnetic tunnel junction pattern MTJ and the bottom electrode BE. The etching of the magnetic tunnel junction layer may include using the conductive mask pattern as an etching mask to sequentially etch the second magnetic layer, the tunnel barrier layer, and the first magnetic layer. The second magnetic layer, the tunnel barrier layer, and the first magnetic layer may be etched to form the second magnetic pattern MP2, the tunnel barrier pattern TBP, and the first magnetic pattern MP1. The conductive mask pattern may remain on the magnetic tunnel junction pattern MTJ after the magnetic tunnel junction layer and the bottom electrode layer are etched, and the remainder of the conductive mask pattern may be defined as the top electrode TE.

An ion beam etching process that uses an ion beam may be used to perform an etching process for etching the magnetic tunnel junction layer and the bottom electrode layer. The ion beam may include inert ions. The etching process may form a recess in an upper portion of the second lower dielectric layer 130 between the data storage patterns DS. Therefore, the second lower dielectric layer 130 on the cell region CR may have a recessed top surface 130RU that is recessed toward the substrate 100. The recessed top surface 130RU of the second lower dielectric layer 130 may be located at a height lower than that of top surfaces 140U of the lower electrode contacts 140. In addition, the etching process may recess an upper portion of the second lower dielectric layer 130 on the peripheral region PR.

The second lower dielectric layer 130 on the peripheral region PR may have a top surface 130U located at a height (or level) lower than that of the recessed top surface 130RU of the second lower dielectric layer 130 on the cell region CR.

The conductive mask patterns may define areas where the data storage patterns DS and the dummy data storage patterns DS_d will be formed, and may be uniformly disposed on the cell region CR.

There may be a reduction in layout difference between an area where subsequently described cell via contacts 200 will be formed and a surrounding area (e.g., difference in pattern density of the conductive mask patterns). Therefore, the area where the cell via contacts 200 will be formed may be limited and/or prevented from being over-etched in the etching process of the magnetic tunnel junction layer and the bottom electrode layer. Accordingly, there may be a reduction in difficulty in etching the magnetic tunnel junction layer and the bottom electrode layer.

A capping dielectric layer 150 may be formed on the second lower dielectric layer 130 on the cell region CR, and may conformally cover top and lateral surfaces of each of the data storage patterns DS and the dummy data storage patterns DS_d. The capping dielectric layer 150 may conformally cover the recessed top surface 130RU of the second lower dielectric layer 130 on the cell region CR, and may extend onto the top surface 130U of the second lower dielectric layer 130 on the peripheral region PR.

Figure 8A:
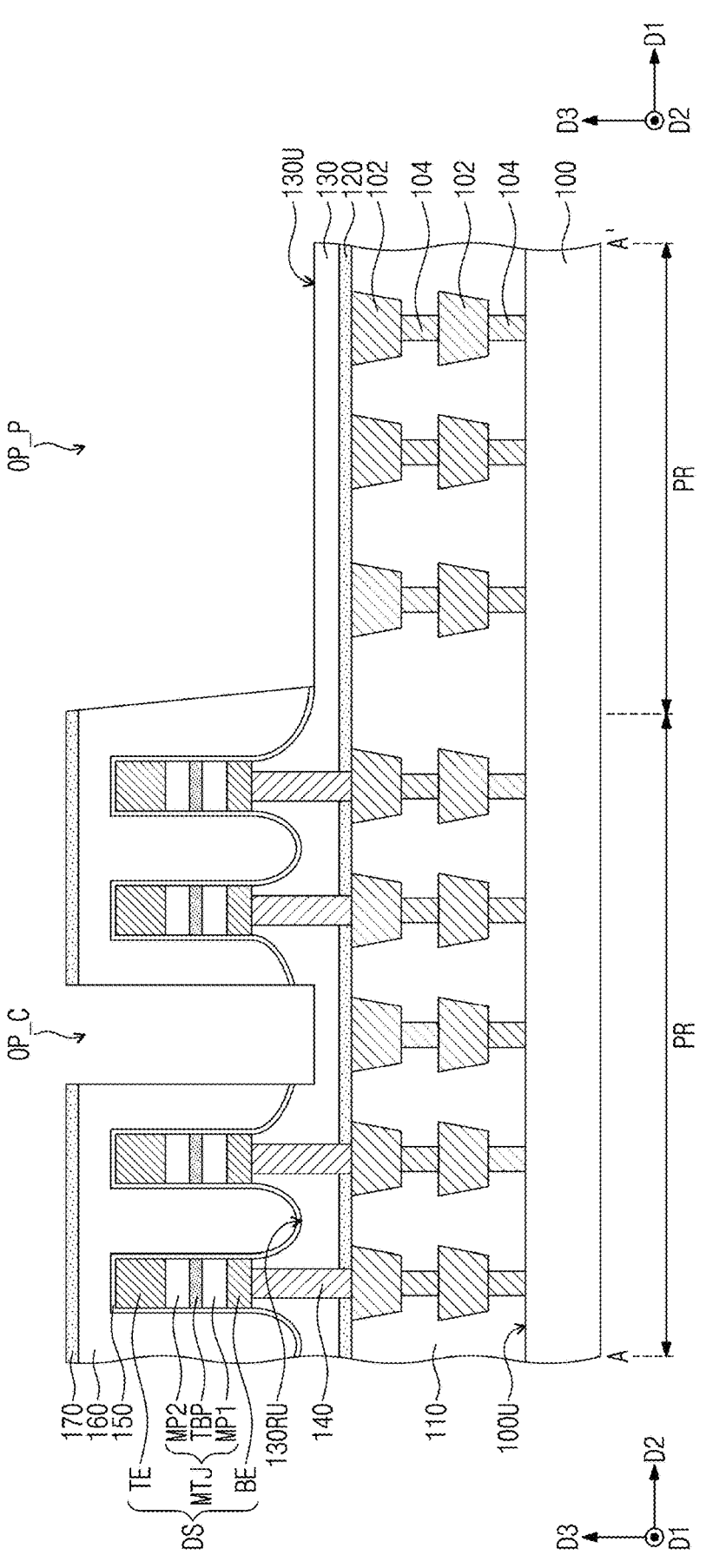
Figure 8B:
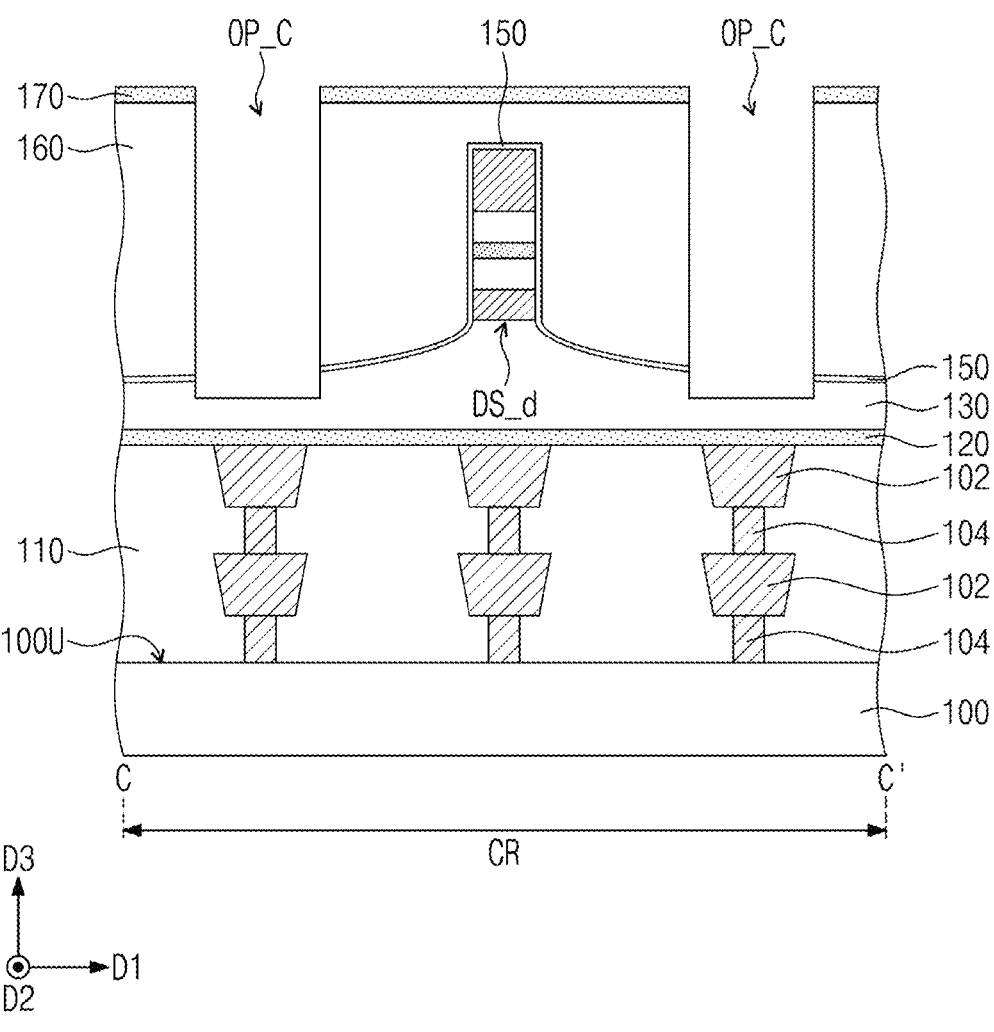

Referring to FIGS. 2, 8A, and 8B, a cell dielectric layer 160 may be formed on the capping dielectric layer 150. As the cell dielectric layer 160 covers the capping dielectric layer 150 on the cell region CR, the cell dielectric layer 160 may cover the data storage patterns DS and the dummy data storage patterns DS_d and may fill a space between the data storage patterns DS. The cell dielectric layer 160 may extend onto the capping dielectric layer 150 on the peripheral region PR. The cell dielectric layer 160 may be formed by using, for example, high density plasma chemical vapor deposition (HDP CVD).

An upper dielectric layer 170 may be formed on the cell dielectric layer 160. The upper dielectric layer 170 may be formed on the cell dielectric layer 160 on the cell region CR, and may extend onto the cell dielectric layer 160 on the peripheral region PR.

A peripheral opening OP_P may be formed on the peripheral region PR, and may expose the top surface 130U of the second lower dielectric layer 130 on the peripheral region PR. The formation of the peripheral opening OP_P may include removing the upper dielectric layer 170, the cell dielectric layer 160, and the capping dielectric layer 150 from the peripheral region PR. For example, the formation of the peripheral opening OP_P may include forming a cell mask pattern on the upper dielectric layer 170 on the cell region CR, and using the cell mask pattern as an etching mask to etch the upper dielectric layer 170, the cell dielectric layer 160, and the capping dielectric layer 150 from the peripheral region PR. The cell mask pattern may be, for example, a photoresist pattern. In the etching process, the upper dielectric layer 170, the cell dielectric layer 160, and the capping dielectric layer 150 on the peripheral region PR may be removed to expose the top surface 130U of the second lower dielectric layer 130 on the peripheral region PR.

According to some embodiments, a cell opening OP_C may be formed on the cell region CR. The cell opening OP_C may penetrate the upper dielectric layer 170, the cell dielectric layer 160, and the capping dielectric layer 150 between the data storage patterns DS that are spaced apart from each other in a second direction D2, and may extend into the second lower dielectric layer 130. The formation of the cell opening OP_C may include, for example, forming the cell mask pattern on the upper dielectric layer 170 on the cell region CR, and using the cell mask pattern as an etching mask to etch the upper dielectric layer 170, the cell dielectric layer 160, the capping dielectric layer 150, and a portion of the second lower dielectric layer 130 between the data storage patterns DS. According to some embodiments, the cell mask pattern may include an opening that defines an area where the cell opening OP_C will be formed. Afterwards, the cell mask pattern may be removed. The cell mask pattern may be removed by performing, for example, one or more of an ashing process and a strip process.

Figure 9A:
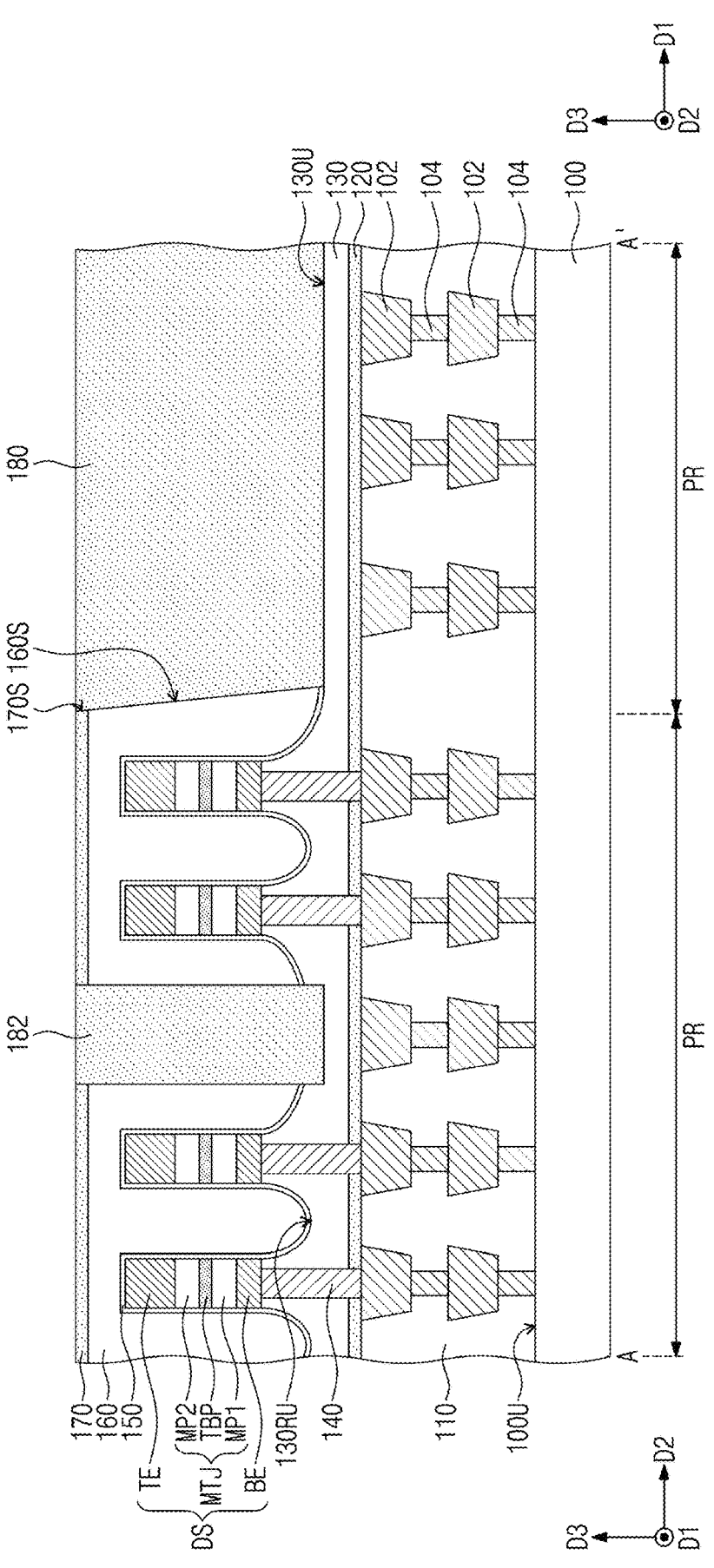
Figure 9B:
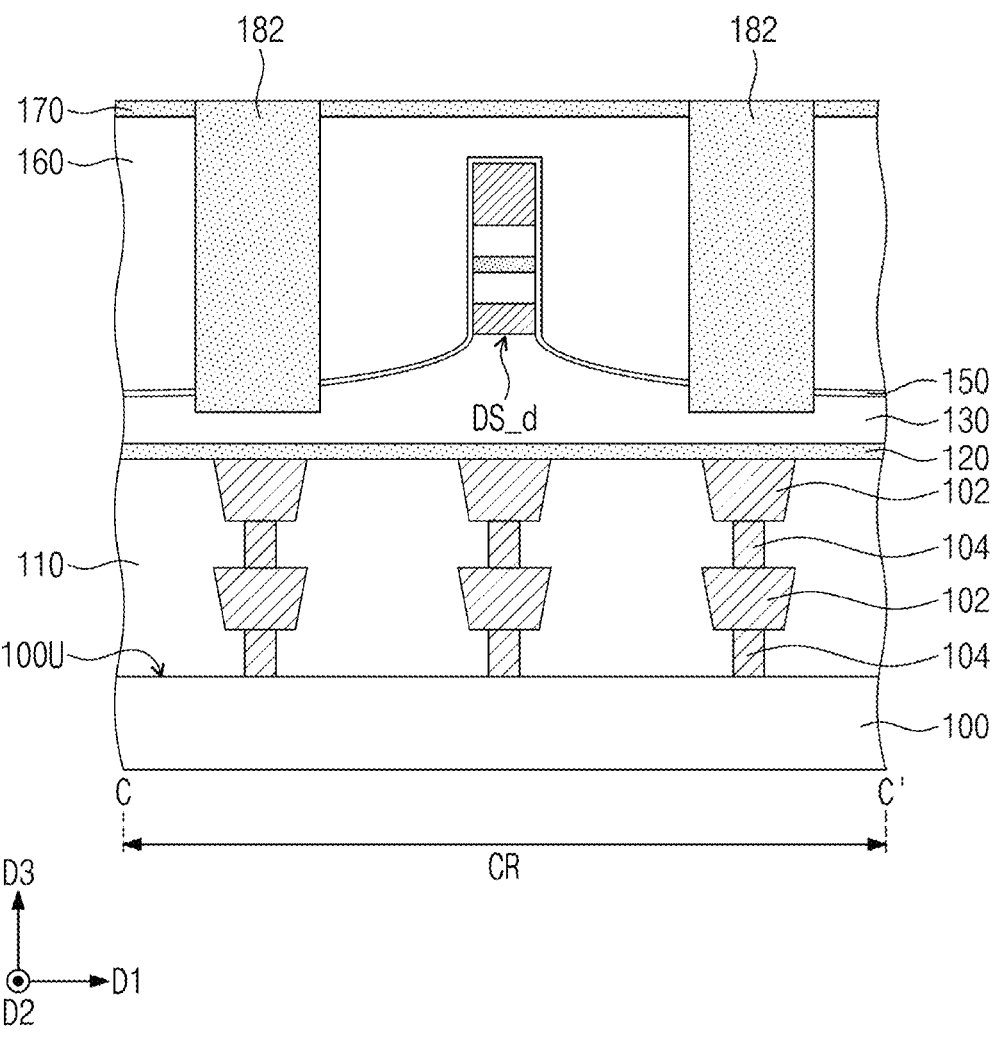

Referring to FIGS. 2, 9A, and 9B, a peripheral dielectric layer 180 may be formed to fill the peripheral opening OP_P. The peripheral dielectric layer 180 may be in contact with the top surface 130U of the second lower dielectric layer 130 on the peripheral region PR. The peripheral dielectric layer 180 may be in contact with a lateral surface 160S of the cell dielectric layer 160 on the cell region CR and a lateral surface 170S of the upper dielectric layer 170 on the cell region CR.

According to some embodiments, a cell dielectric pattern 182 may be formed to fill the cell opening OP_C. The peripheral dielectric layer 180 and the cell dielectric pattern 182 may include a dielectric material whose dielectric constant is less than that of the cell dielectric layer 160 and the upper dielectric layer 170. The peripheral dielectric layer 180 and the cell dielectric pattern 182 may include the same material. The formation of the peripheral dielectric layer 180 and the cell dielectric pattern 182 may include, for example, forming a dielectric layer that fills the peripheral opening OP_P and the cell opening OP_C, and planarizing the dielectric layer until a top surface of the upper dielectric layer 170 is exposed. The dielectric layer may be formed by using, for example, chemical vapor deposition. The planarization process may be performed by using, for example, at least one selected from an etch-back process and a chemical mechanical polishing process.

Figure 10A:
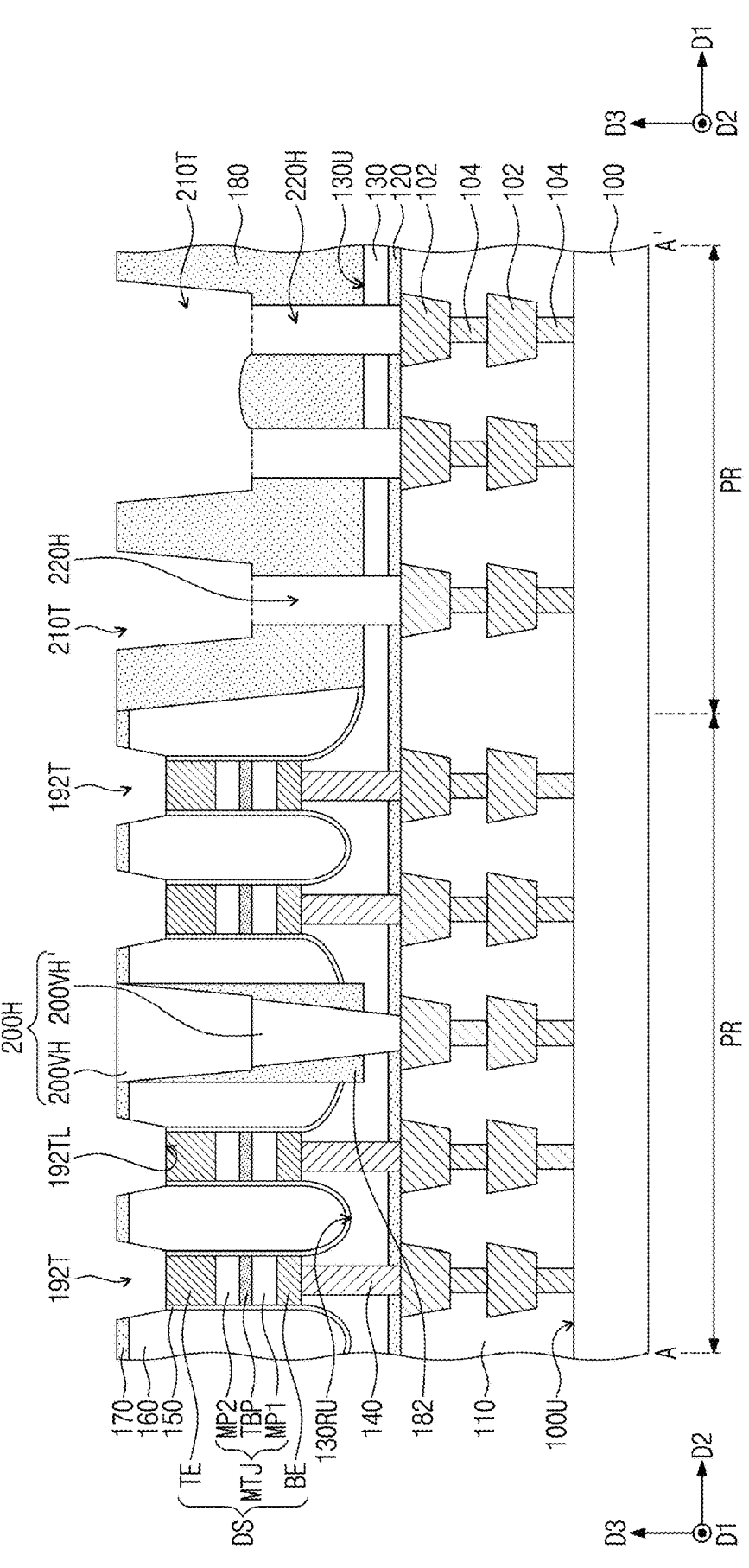
Figure 10B:
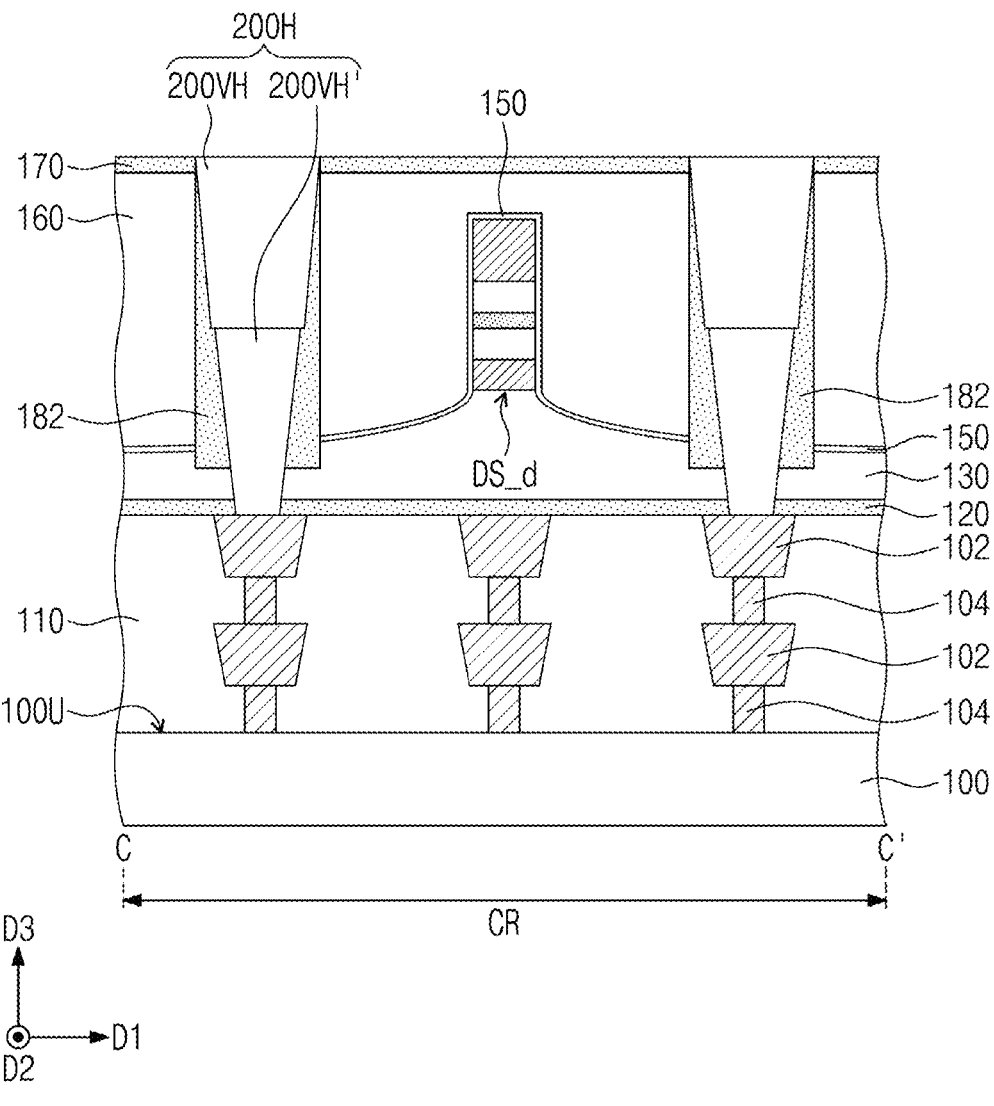

Referring to FIGS. 2, 10A, and 10B, first cell trenches 192T may be formed on the cell region CR. The first cell trenches 192T may extend in a first direction D1 and may be spaced apart from each other in the second direction D2. The first cell trenches 192T may each have a linear shape that extends in the first direction D1, and may expose corresponding data storage patterns DS that are spaced apart from each other in the first direction D1 among the data storage patterns DS. Each of the first cell trenches 192T may penetrate the upper dielectric layer 170 and an upper portion of the cell dielectric layer 160. Bottom surfaces 192TL of the first cell trenches 192T may correspondingly expose the top electrodes TE of the corresponding data storage patterns DS.

Cell via holes 200H may be formed between the first cell trenches 192T on the cell region CR, and may be spaced apart from each other in the first direction D1 between the first cell trenches 192T. The cell via holes 200H may be spaced apart horizontally (e.g., in the second direction D2) from the first cell trenches 192T. In addition, the cell via holes 200H may be aligned in the second direction D2 with the data storage patterns DS that are spaced apart from each other in the second direction D2, and may be formed between the dummy data storage patterns DS_d that are spaced apart from each other in the first direction D1. The cell via holes 200H and the dummy data storage patterns DS_d may be alternately disposed along the first direction D1.

Each of the cell via holes 200H may include a first vertical hole 200VH and a second vertical hole 200VH' that extends along the third direction D3 from the first vertical hole 200VH and between the data storage patterns DS. According to some embodiments, the first vertical hole 200VH of each of the cell via contacts 200 may penetrate the upper dielectric layer 170, an upper portion of the cell dielectric layer 160, and an upper portion of the cell dielectric pattern 182. According to some embodiments, the second vertical hole 200VH' may be disposed in the cell dielectric pattern 182. The first vertical hole 200VH may penetrate the cell dielectric pattern 182, the second lower dielectric layer 130, and the first lower dielectric layer 120, and may expose a top surface of a corresponding one of the uppermost wiring lines 102.

Peripheral trenches 210T may be formed in the peripheral dielectric layer 180 on the peripheral region PR. Each of the peripheral trenches 210T may penetrate an upper portion of the peripheral dielectric layer 180 on the peripheral region PR. Peripheral holes 220H may extend along the third direction D3 toward the substrate 100 from bottom surfaces of the peripheral trenches 210T. Each of the peripheral holes 220H may penetrate a lower portion of the peripheral dielectric layer 180, the second lower dielectric layer 130, and the first lower dielectric layer 120 on the peripheral region PR, thereby exposing a top surface of a corresponding one of the uppermost wiring lines 102.

A first etching process may form the first cell trenches 192T, the first vertical hole 200VH, and the peripheral trenches 210T. The first etching process may include, for example, forming a first mask pattern that defines areas on which are formed the first cell trenches 192T, the first vertical hole 200VH, and the peripheral trenches 210T, and using the first mask pattern as an etching mask to etch the upper dielectric layer 170, the cell dielectric layer 160, the cell dielectric pattern 182, and the peripheral dielectric layer 180. The first cell trenches 192T, the first vertical hole 200VH, and the peripheral trenches 210T may be formed at the same time in the first etching process.

A second etching process may form the peripheral holes 220H and the second vertical hole 200VH' of each of the cell via holes 200H. The second etching process may include, for example, forming a second mask pattern that defines areas on which are formed the peripheral holes 220H and the second vertical hole 200VH' of each of the cell via holes 200H, and using the second mask pattern as an etching mask to etch the cell dielectric pattern 182, the peripheral dielectric layer 180, the second lower dielectric layer 130, and the first lower dielectric layer 120. The peripheral holes 220H and the second vertical hole 200VH' of each of the cell via holes 200H may be formed at the same time in the second etching process.

Referring back to FIGS. 2 to 5, first cell conductive lines 192 may be correspondingly formed in the first cell trenches 192T, and cell via contacts 200 may be correspondingly formed in the cell via holes 200H. Peripheral conductive lines 210 may be correspondingly formed in the peripheral trenches 210T, and peripheral conductive contacts 220 may be correspondingly formed in the peripheral holes 220H.

The formation of the first cell conductive lines 192, the cell via contacts 200, the peripheral conductive lines 210, and the peripheral conductive contacts 220 may include, for example, forming on the upper dielectric layer 170 and the peripheral dielectric layer 180 a first conductive layer that fills the cell via holes 200H, the peripheral trenches 210T, and the peripheral holes 220H, and planarizing the first conductive layer until exposing a top surface 170U of the upper dielectric layer 170 and a top surface 180U of the peripheral dielectric layer 180. The planarization process may cause the first cell conductive lines 192 to have their top surfaces 192U located at the same height as that of the top surface 170U of the upper dielectric layer 170, that of top surfaces 200U of the cell via contacts 200, that of the top surface 180U of the peripheral dielectric layer 180, and that of top surfaces 210U of the peripheral conductive lines 210.

A first interlayer dielectric layer 230 may be formed on the cell region CR and the peripheral region PR, and may cover the top surface 170U of the upper dielectric layer 170, the top surfaces 192U of the first cell conductive lines 192, the top surfaces 200U of the cell via contacts 200, the top surface 180U of the peripheral dielectric layer 180, and the top surfaces 210U of the peripheral conductive lines 210.

Second cell conductive lines 196 and first conductive contacts 194 may be formed in the first interlayer dielectric layer 230. The formation of the second cell conductive lines 196 and the first conductive contacts 194 may include, for example, forming second cell trenches that penetrate an upper portion of the first interlayer dielectric layer 230, forming first holes that penetrate a lower portion of the first interlayer dielectric layer 230 from bottom surfaces of the second cell trenches, forming on the first interlayer dielectric layer 230 a second conductive layer that fills the second cell trenches and the first holes, and planarizing the second conductive layer until a top surface of the first interlayer dielectric layer 230 is exposed.

A second interlayer dielectric layer 240 may be formed on the cell region CR and the peripheral region PR, and may cover top surfaces of the second cell conductive lines 196. Upper conductive lines 260 may be formed on the second interlayer dielectric layer 240 on the cell region CR, and second conductive contacts 250 may be formed in the second interlayer dielectric layer 240. The second conductive contacts 250 may penetrate the first and second interlayer dielectric layers 230 and 240 to come into connection with corresponding cell via contacts 200. The upper conductive lines 260 and the second conductive contacts 250 may be formed by, for example, a method the same as or substantially the same as that used for forming the second cell conductive lines 196 and the first conductive contacts 194.

The cell via contacts 200 may electrically connect the upper conductive lines 260, which serve as the word lines WL of FIG. 1, to the wiring lines 102 in the wiring structure 102 and 104. The upper conductive lines 260 may have a resistance less than that of the wiring lines 102 in the wiring structure 102 and 104, and thus there may be a reduction in resistance of the word line WL that constitutes the memory cell MC of FIG. 1.

Embodiments of inventive concepts may provide a semiconductor device having improved electrical properties and/or a method of fabricating the same.

Figure 11A:
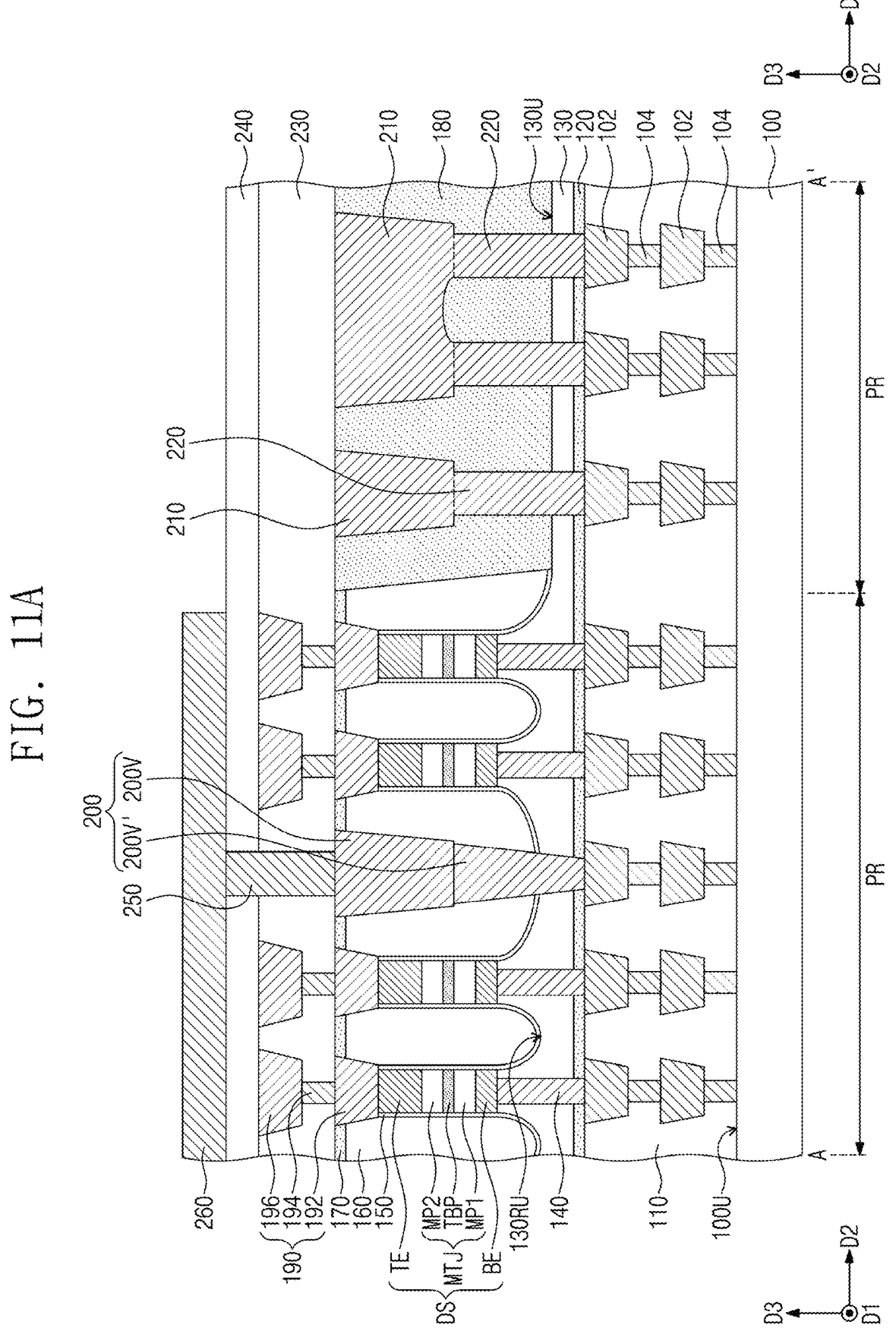
FIG. 11A illustrates a cross-sectional view taken along line A-A' of FIG. 2, showing a semiconductor device according to some embodiments of inventive concepts.
Figure 11B:
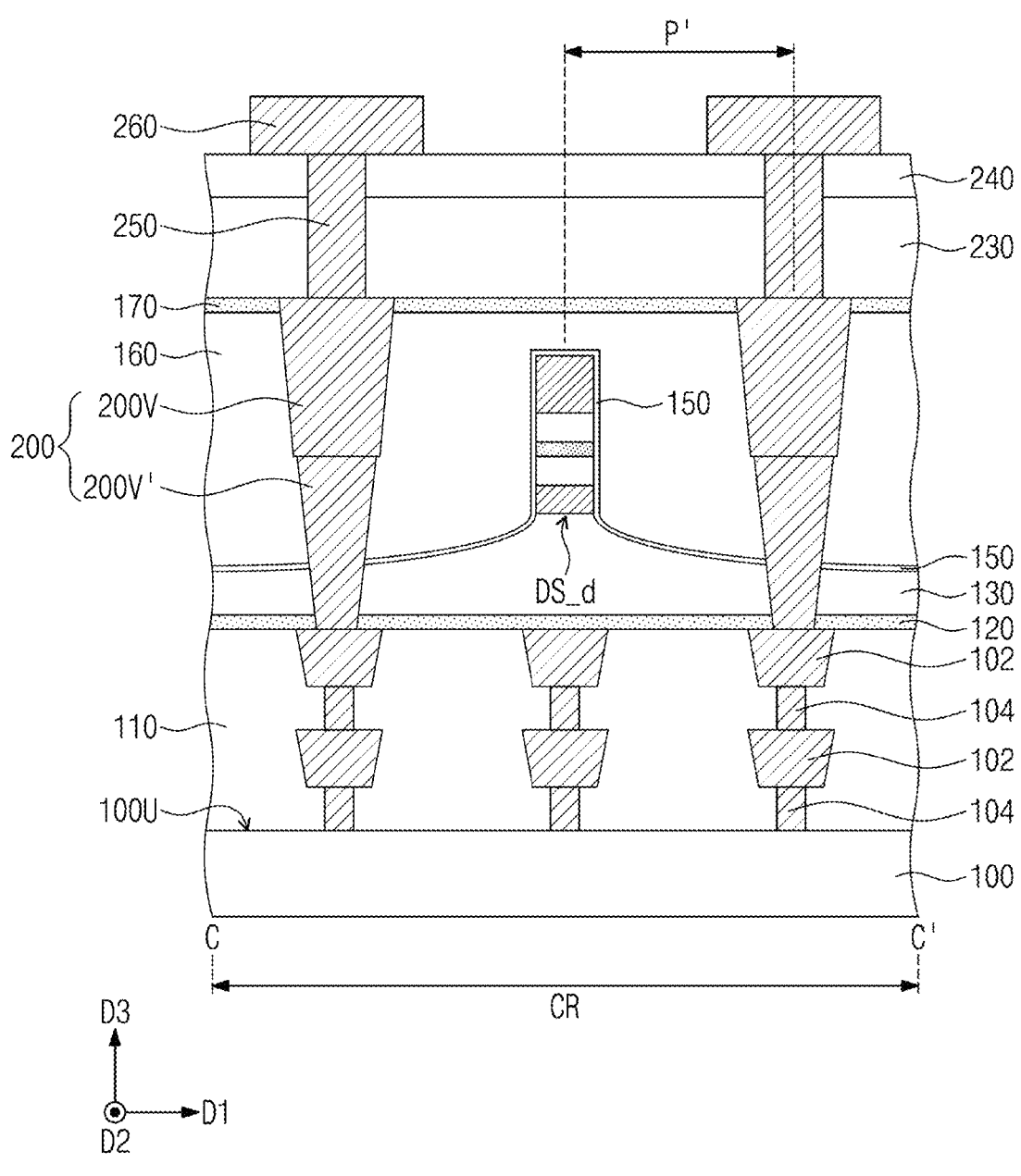
FIG. 11B illustrates a cross-sectional view taken along line C-C' of FIG. 2, showing a semiconductor device according to some embodiments of inventive concepts.

FIG. 11A illustrates a cross-sectional view taken along line A-A' of FIG. 2, showing a semiconductor device according to some embodiments of inventive concepts. FIG. 11B illustrates a cross-sectional view taken along line C-C' of FIG. 2, showing a semiconductor device according to some embodiments of inventive concepts. The following semiconductor device is similar to that discussed with reference to FIGS. 2 to 5, 6A, and 6B, and thus the major differences between the semiconductor devices will be described below in the interest of brevity of description. Referring to FIGS. 2, 11A, and 11B, according to some embodiments, the cell dielectric pattern 182 may be omitted which is discussed with reference to FIG. 3. In this case, each of the cell via contacts 200 may penetrate the upper dielectric layer 170, the cell dielectric layer 160, the capping dielectric layer 150, the second lower dielectric layer 130, and the first lower dielectric layer 120. The first vertical part 200V of each of the cell via contacts 200 may penetrate the upper dielectric layer 170 and an upper portion of the cell dielectric layer 160. The second vertical part 200V' of each of the cell via contacts 200 may extend toward the substrate 100. The second vertical part 200V' may penetrate a lower portion of the cell dielectric layer 160, the capping dielectric layer 150, the second lower dielectric layer 130, and the first lower dielectric layer 120, and may be connected to a corresponding one of the uppermost wiring lines 102. Except for mentioned above, a semiconductor device according to the present embodiment is substantially the same as that discussed with reference to FIGS. 5, 6A, and 6B.

Figure 12:
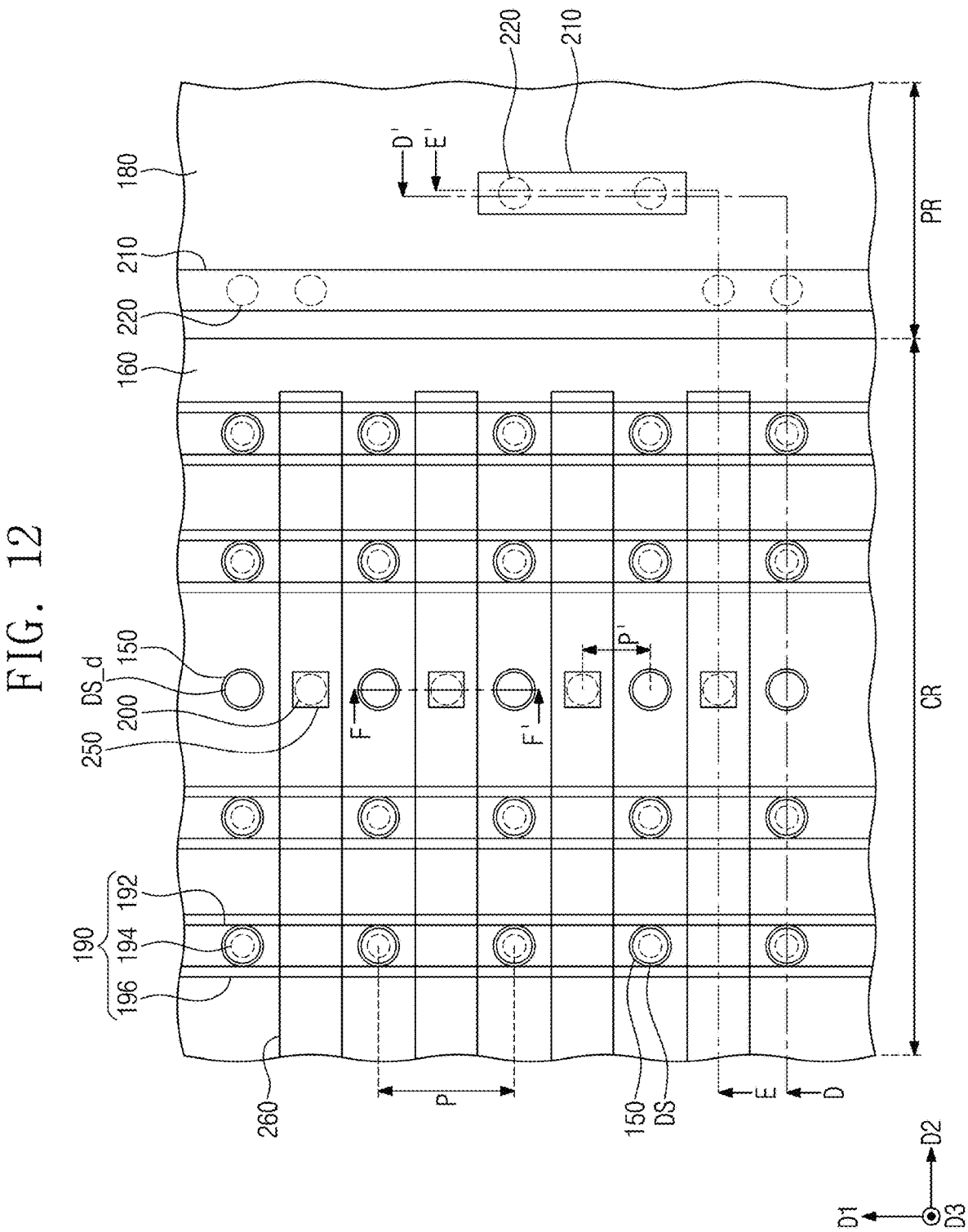
FIG. 12 illustrates a plan view showing a semiconductor device according to some embodiments of inventive concepts.
Figure 13:
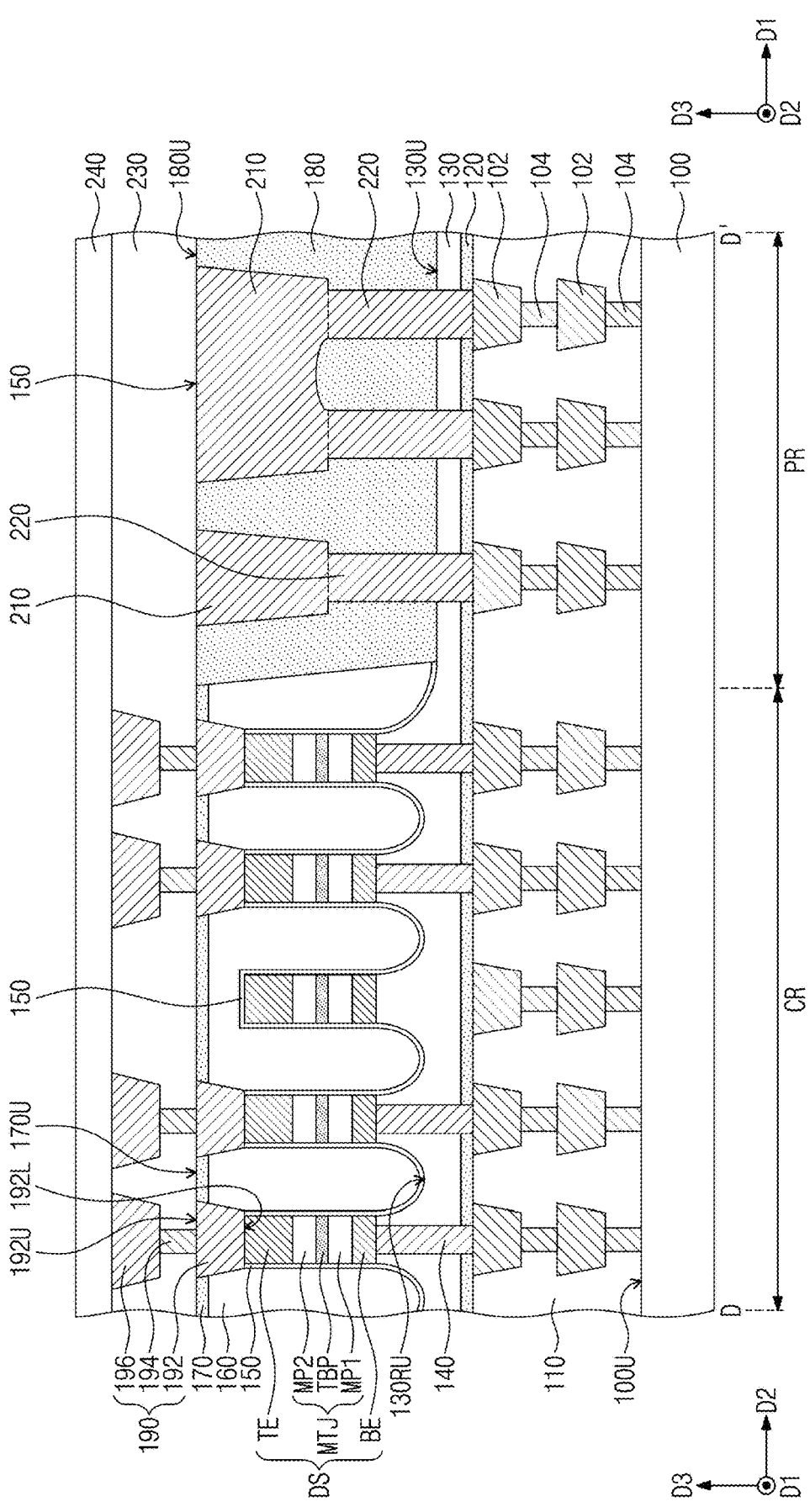
FIG. 13 illustrates a cross-sectional view taken along line D-D' of FIG. 12, showing a semiconductor device according to some embodiments of inventive concepts.
Figure 14:
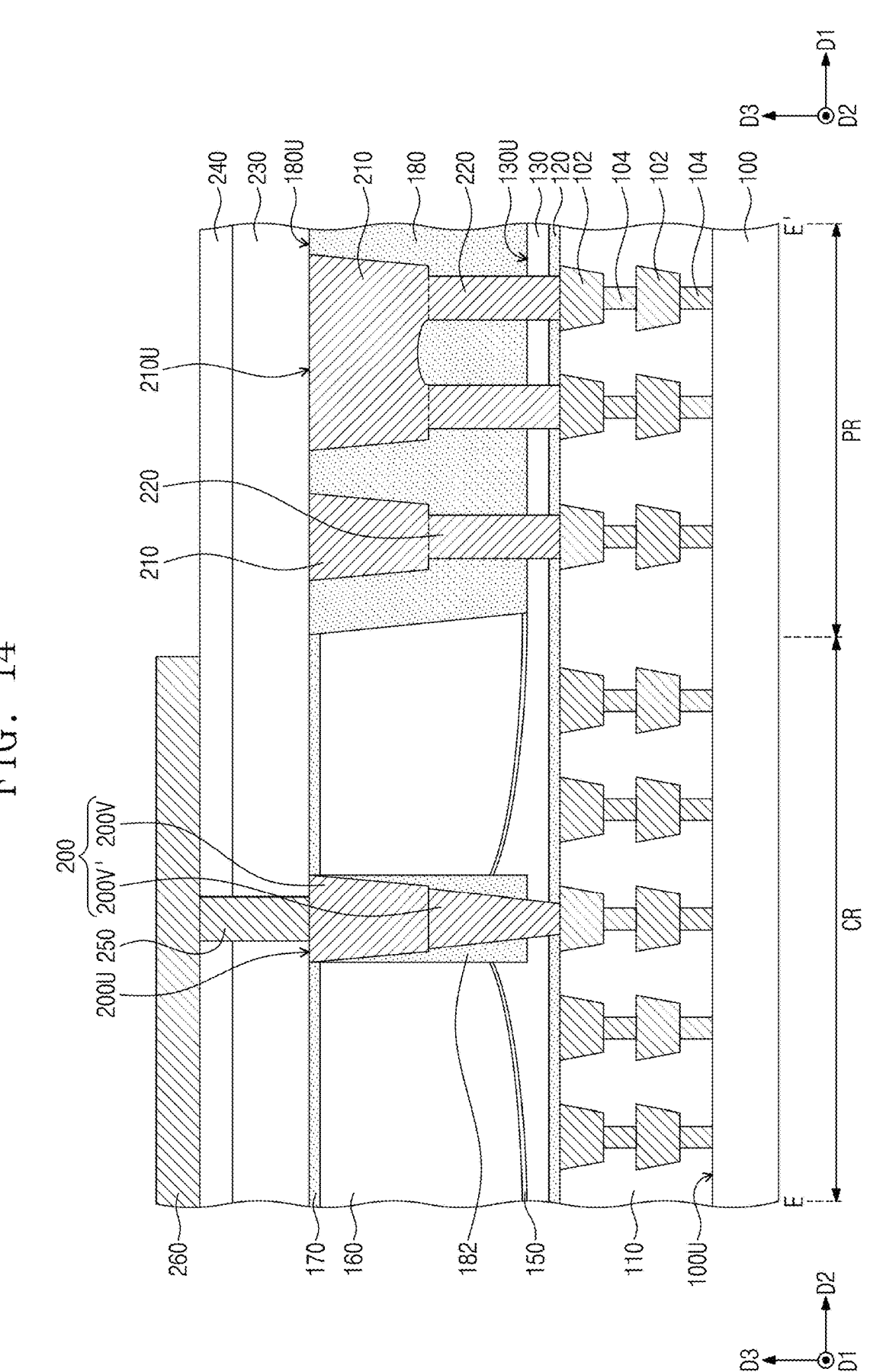
FIG. 14 illustrates a cross-sectional view taken along line E-E' of FIG. 12, showing a semiconductor device according to some embodiments of inventive concepts.
Figure 15:
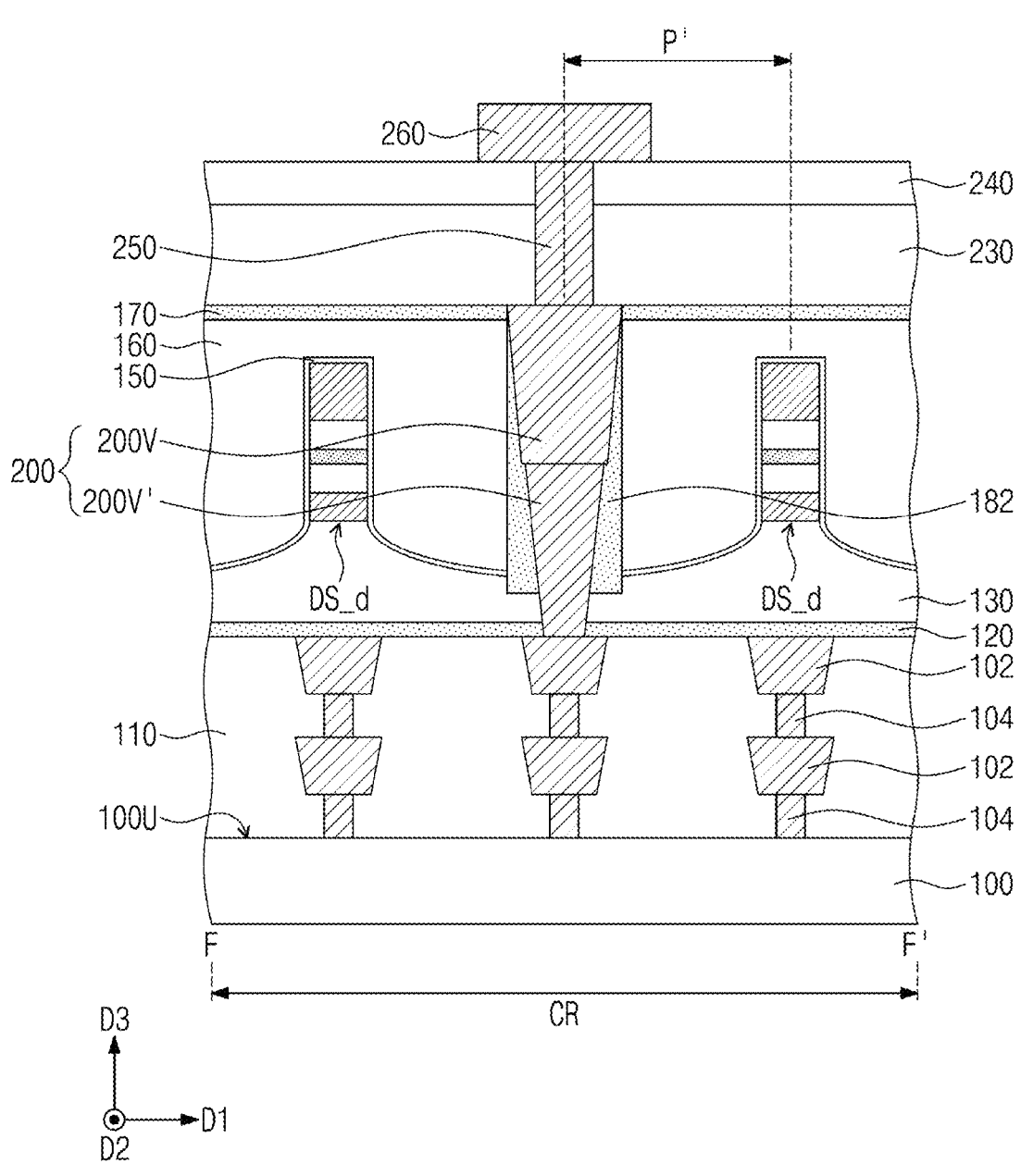
FIG. 15 illustrates a cross-sectional view taken along line F-F' of FIG. 12, showing a semiconductor device according to some embodiments of inventive concepts.

FIG. 12 illustrates a plan view showing a semiconductor device according to some embodiments of inventive concepts. FIG. 13 illustrates a cross-sectional view taken along line D-D' of FIG. 12. FIG. 14 illustrates a cross-sectional view taken along line E-E' of FIG. 12. FIG. 15 illustrates a cross-sectional view taken along line F-F' of FIG. 12. The following semiconductor device is similar to that discussed with reference to FIGS. 2 to 5, 6A, and 6B, and thus the major differences between the semiconductor devices will be described below in the interest of brevity of description.

Referring to FIGS. 12 to 15, according to some embodiments, the data storage patterns DS may include data storage patterns DS of a first column that are spaced apart from each other in the first direction D1 and data storage patterns DS of a second column that are spaced apart from each other in the first direction D1. The data storage patterns DS of the second column may be spaced apart in the second direction D2 from the data storage patterns DS of the first column.

The dummy data storage patterns DS_d may be disposed between the data storage patterns DS of the first column and the data storage patterns DS of the second column, and may be spaced apart from each other in the first direction D1. The dummy data storage patterns DS_d may be spaced apart in the second direction D2 from the data storage patterns DS of the first column, and the data storage patterns DS of the second column may be spaced apart in the second direction D2 from the dummy data storage patterns DS_d. The dummy data storage patterns DS_d may be disposed aligned in the second direction D2 with the data storage patterns DS of the first column and the data storage patterns DS of the second column.

The cell via contacts 200 may be disposed between the first cell conductive lines 192 on the cell region CR. The cell via contacts 200 may be disposed between the data storage patterns DS of the first column and the data storage patterns DS of the second column, and may be spaced apart from each other in the first direction D1. The cell via contacts 200 may be spaced apart in the second direction D2 from the data storage patterns DS of the first column, and the data storage patterns DS of the second column may be spaced apart in the second direction D2 from the cell via contacts 200. The cell via contact 200 may be arranged to be offset in a first direction D1 from the data storage pattern DS of the first column and the data storage pattern DS of the second column.

The dummy data storage pattern DS_d and the cell via contact 200 may be spaced apart at a second pitch P' from each other along the first direction D1. The second pitch P' may be less than the first pitch P1, for example, about half the first pitch P. Except for mentioned above, a semiconductor device according to the present embodiment is substantially the same as that discussed with reference to FIGS. 5, 6A, and 6B.

FIGS. 16A, 17A, 18A, and 19A illustrate cross-sectional views taken along line D-D' of FIG. 12, showing a method of fabricating a semiconductor device according to some embodiments of inventive concepts. FIGS. 16B, 17B, 18B, and 19B illustrate cross-sectional views taken along line E-E' of FIG. 12, showing a method of fabricating a semiconductor device according to some embodiments of inventive concepts. The following semiconductor device is similar to that discussed with reference to FIGS. 2 to 5, 6A, 6B, 7A, 8A, 9A, 10A, 7B, 8B, 9B, and 10B, and thus the major differences between the semiconductor devices will be described below in the interest of brevity of description.

Figure 16A:
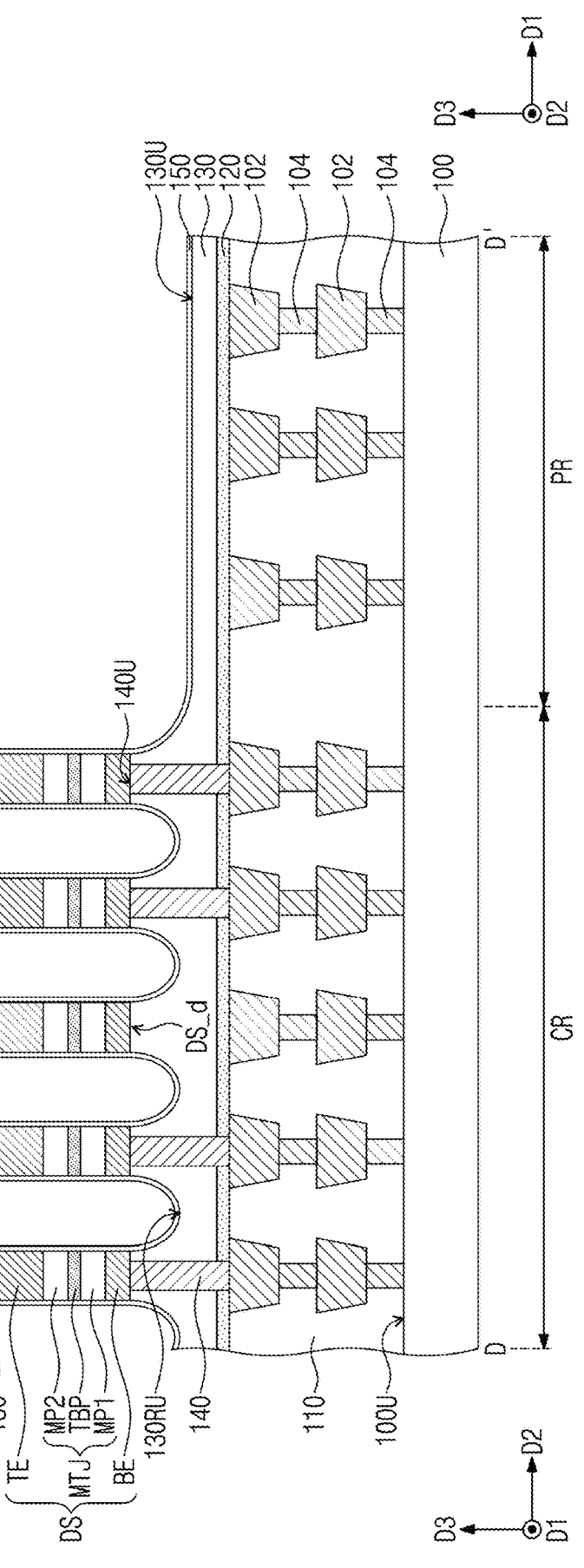
FIGS. 16A, 17A, 18A, and 19A illustrate cross-sectional views taken along line D-D' of FIG. 12, showing a method of fabricating a semiconductor device according to some embodiments of inventive concepts.
Figure 16B:
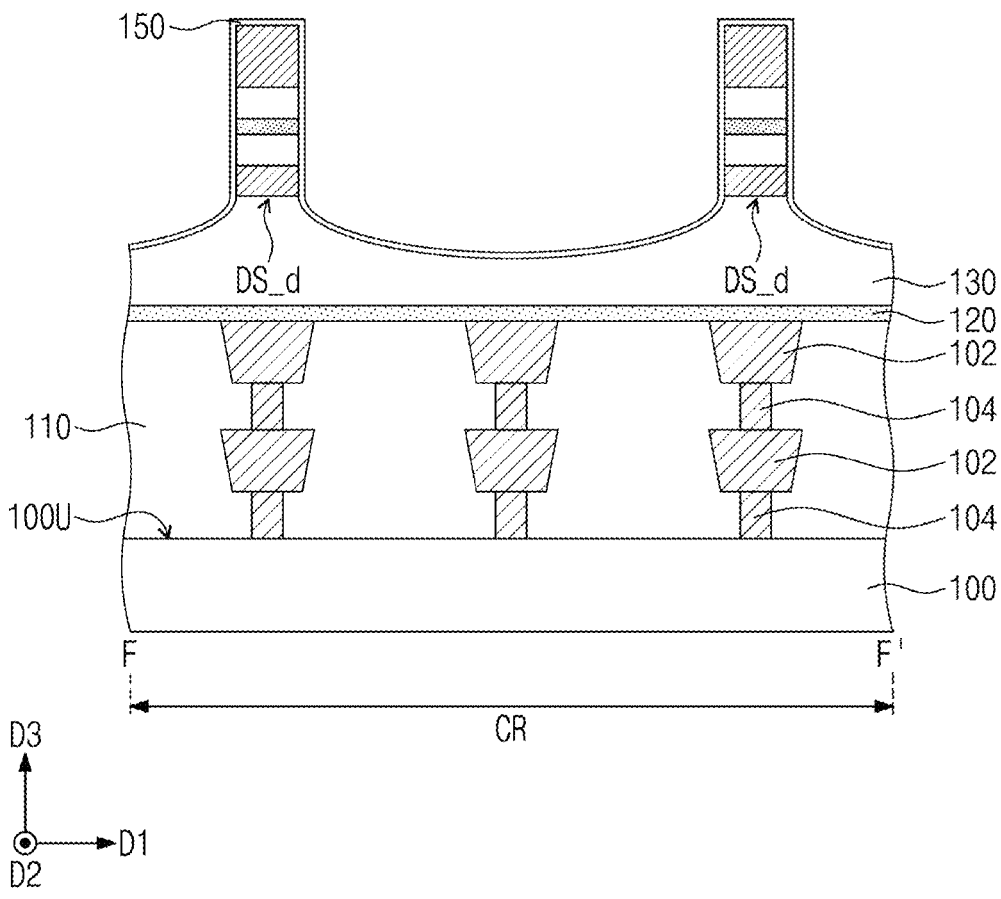
FIGS. 16B, 17B, 18B, and 19B illustrate cross-sectional views taken along line E-E' of FIG. 12, showing a method of fabricating a semiconductor device according to some embodiments of inventive concepts.

Referring to FIGS. 12, 16A, and 16B, the data storage patterns DS and the dummy data storage patterns DS_d may each include a bottom electrode BE, a magnetic tunnel junction pattern MTJ, and a top electrode TE that are sequentially stacked on the second lower dielectric layer 130. The formation of the dummy data storage patterns DS_d may include, for example, sequentially forming a bottom electrode layer and a magnetic tunnel junction layer on the second lower dielectric layer 130, forming conductive mask patterns on the magnetic tunnel junction layer, and using the conductive mask patterns as an etching mask to sequentially etch the magnetic tunnel junction layer and the bottom electrode layer.

The data storage patterns DS may include data storage patterns DS of a first column that are spaced apart in the first direction D1 and data storage patterns DS of a second column that are spaced apart in the first direction D1. The data storage patterns DS of the second column may be spaced apart in the second direction D2 from the data storage patterns DS of the first column.

The dummy data storage patterns DS_d may be disposed between the data storage patterns DS of the first column and the data storage patterns DS of the second column, and may be spaced apart from each other in the first direction D1. Each of the dummy data storage patterns DS_d may be formed aligned in the second direction D2 with the data storage patterns DS that are arranged in the second direction D2 among the data storage patterns DS.

Figure 17A:
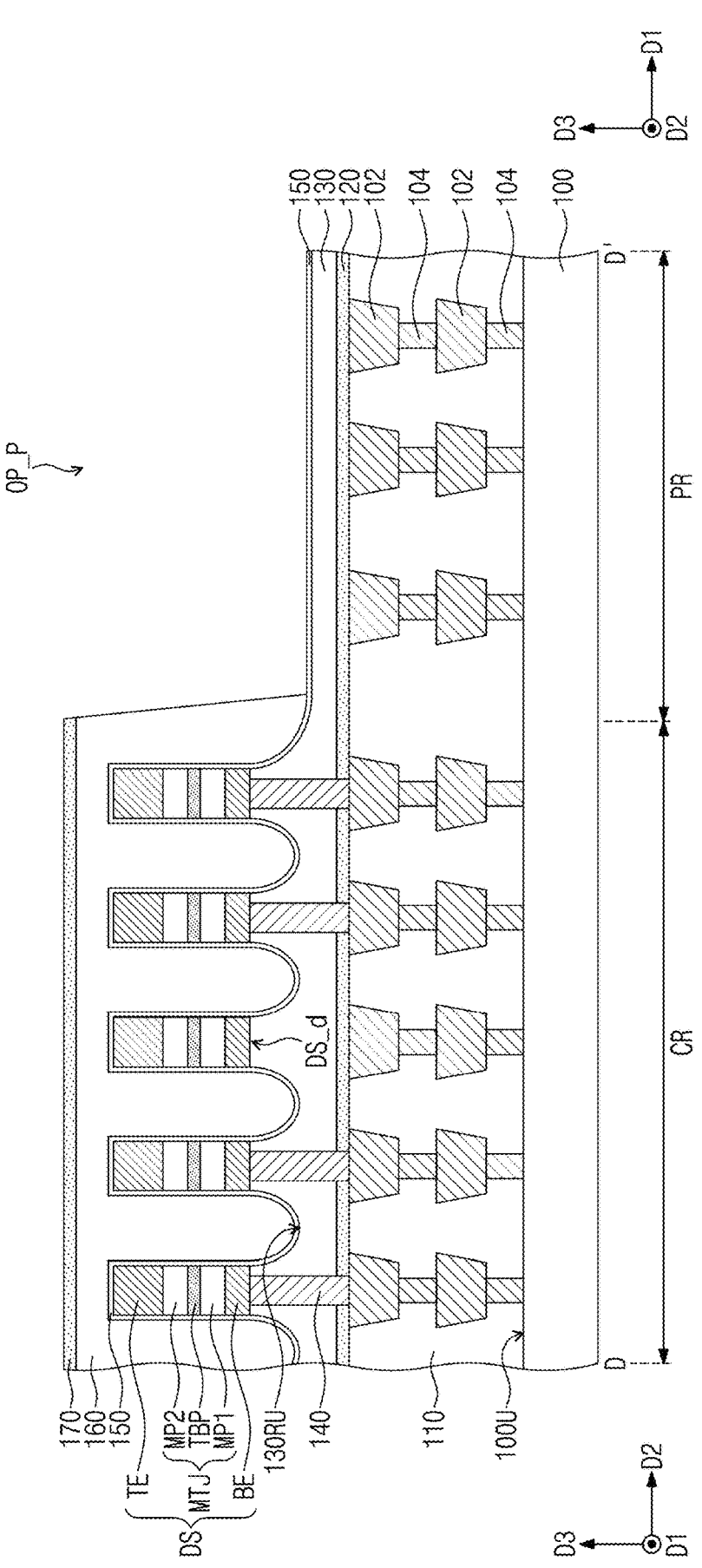
Figure 17B:
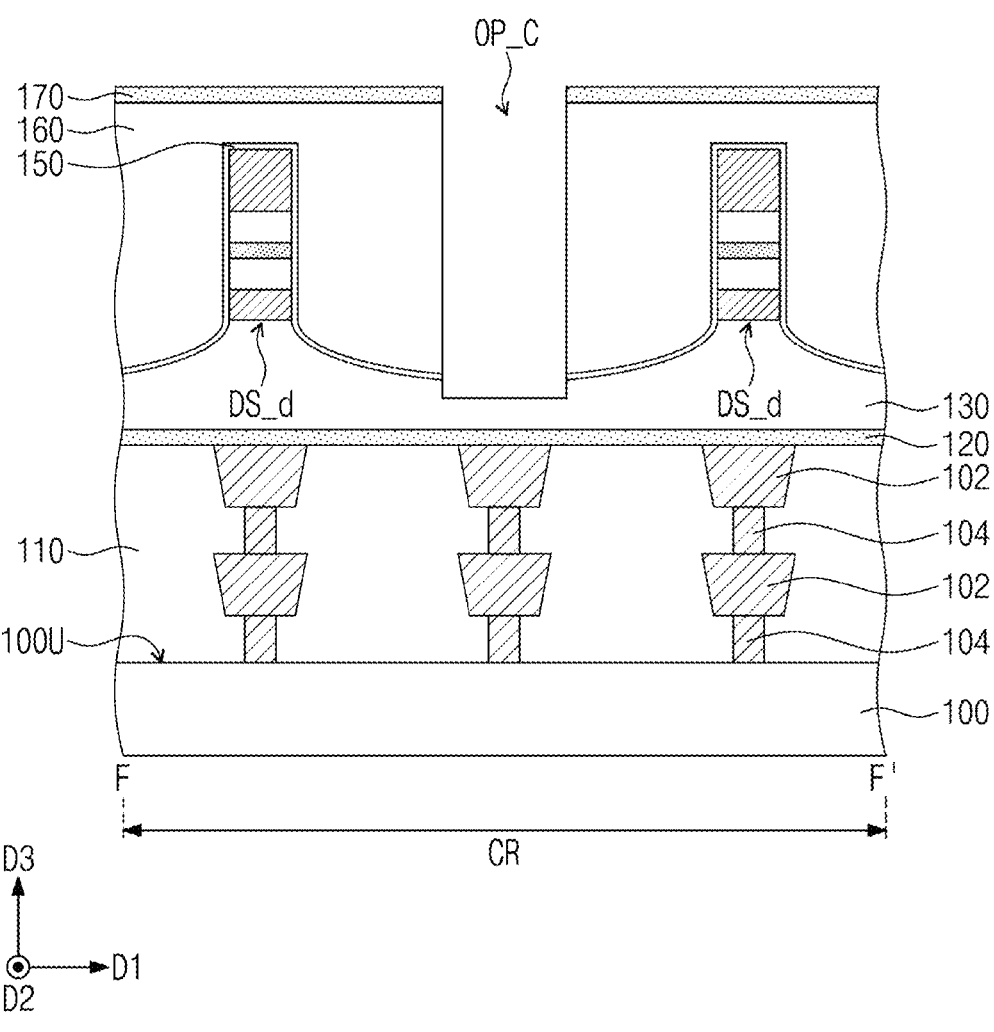

Referring to FIGS. 12, 17A, and 17B, according to some embodiments, a cell opening OP_C may be formed on the cell region CR. The cell opening OP_C may be formed offset in the first direction D1 from the data storage patterns DS that are arranged in the first direction D1. The cell opening OP_C may expose the second lower dielectric layer 130 between the data storage patterns DS_d that are spaced apart from each other in the first direction D1, may penetrate the upper dielectric layer 170, the cell dielectric layer 160, and the capping dielectric layer 150, and may extend into the second lower dielectric layer 130.

Figure 18A:
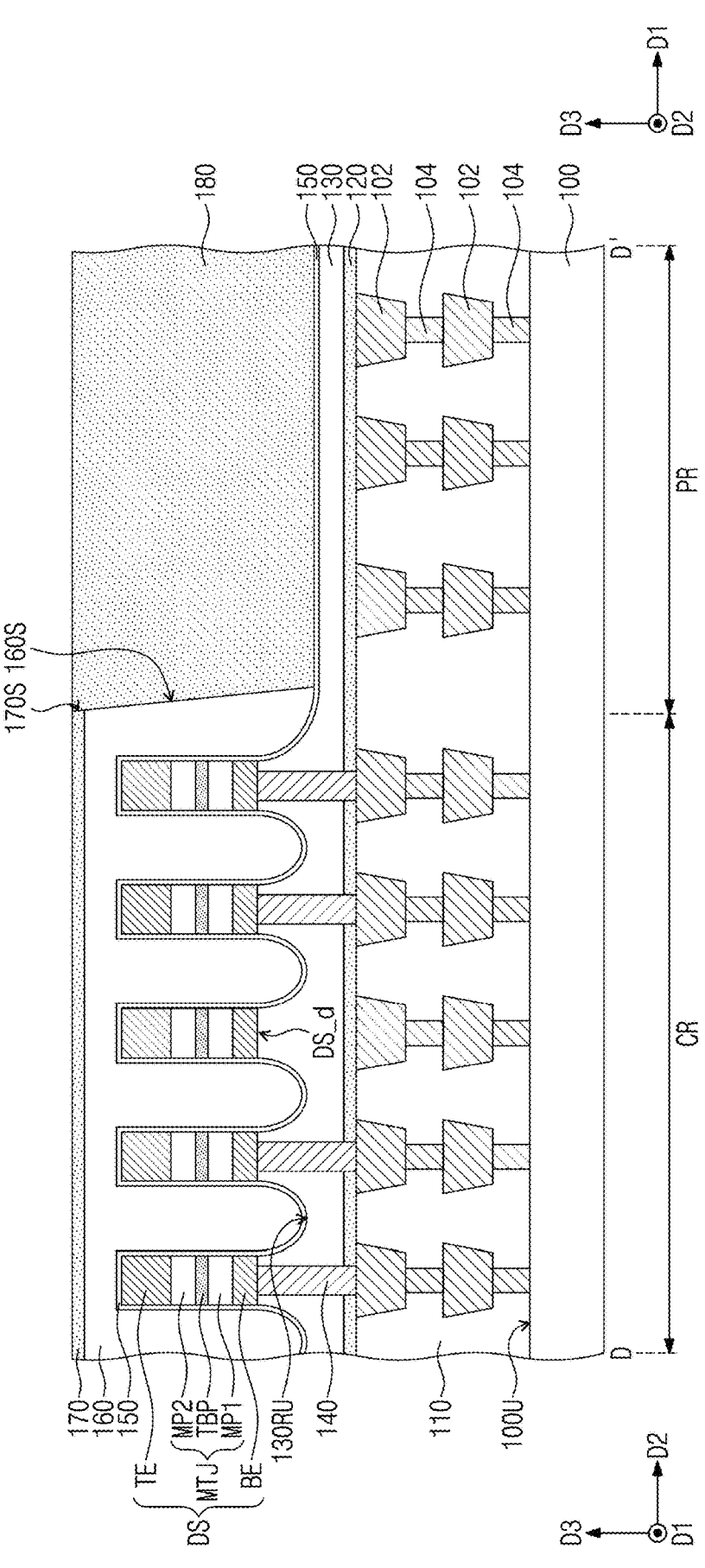
Figure 18B:
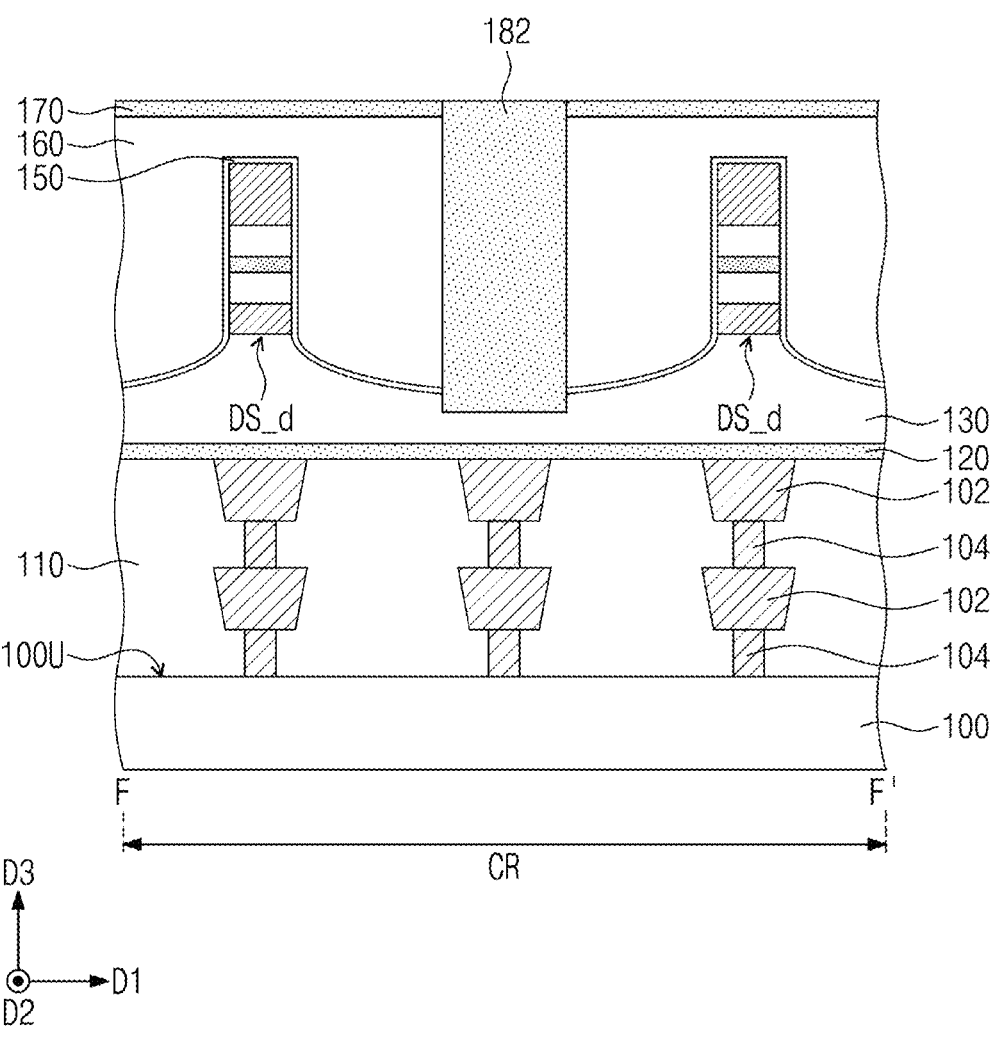
Figure 19A:
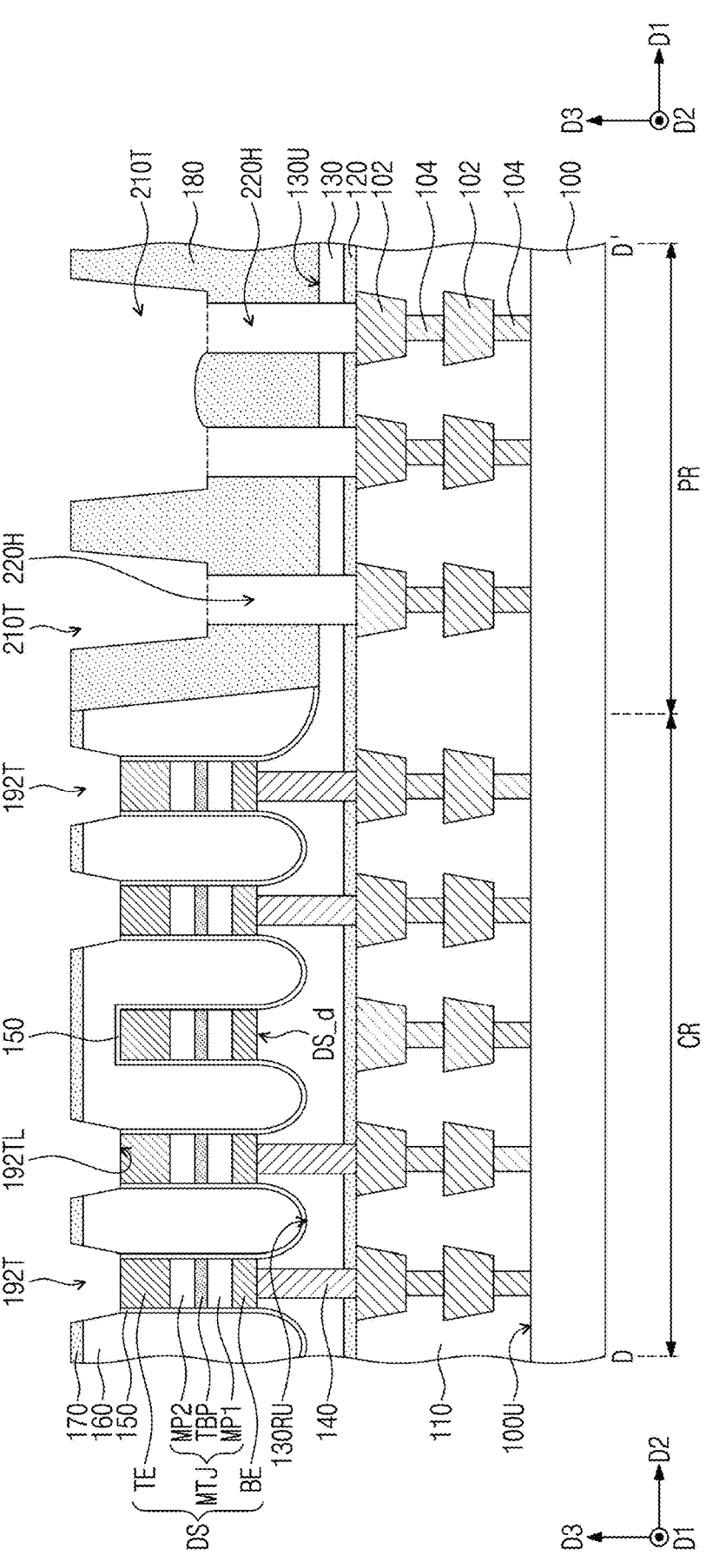
Figure 19B:
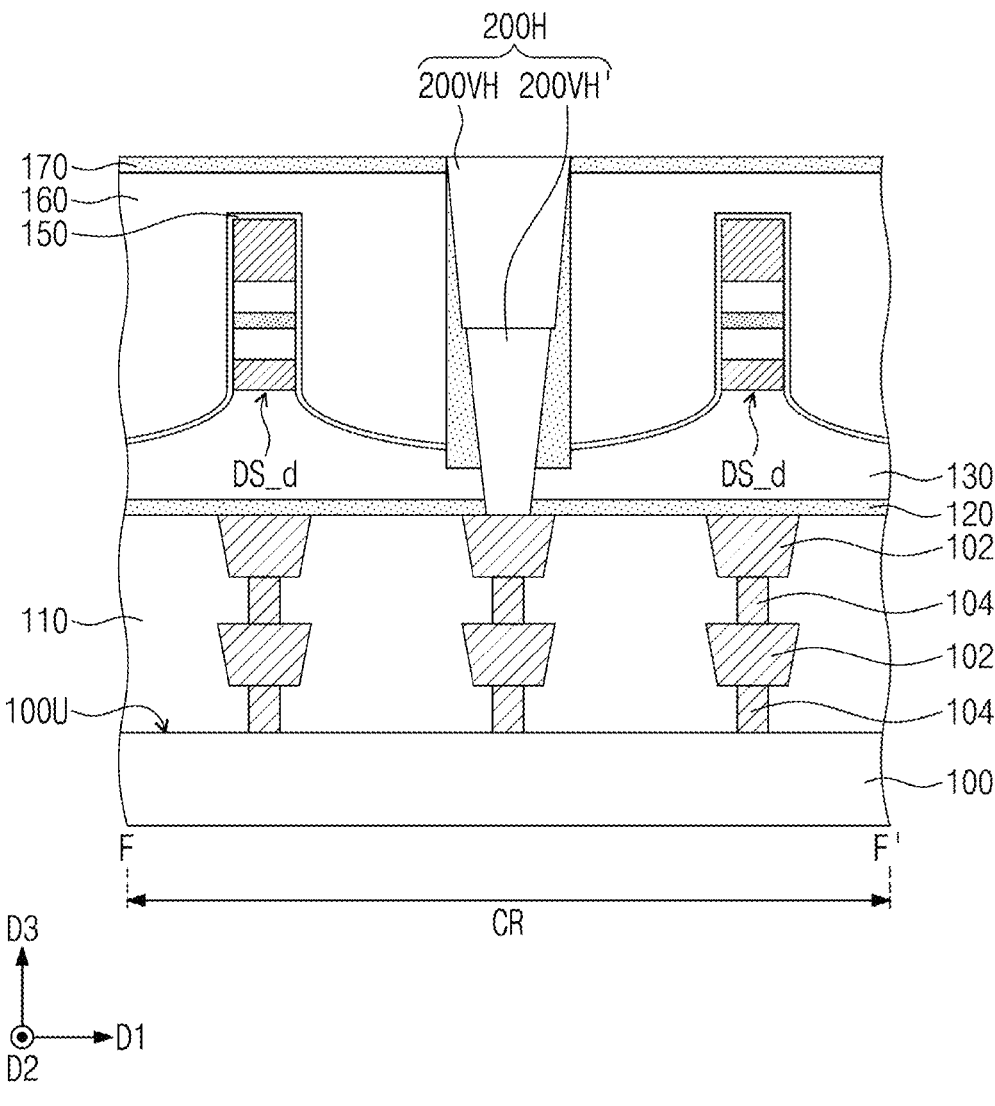

Referring to FIGS. 12, 18A, and 18B, according to some embodiments, a cell dielectric pattern 182 may be formed to fill the cell opening OP_C. Referring to FIGS. 12, 19A, and 19B, cell via holes 200H may be formed between the first cell trenches 192T on the cell region CR. The cell via holes 200H may be spaced apart from each other in the first direction D1 between the first cell trenches 192T, and may be spaced apart horizontally (e.g., in the second direction D2) from the first cell trenches 192T. The cell via holes 200H may be formed offset in the first direction D1 from the data storage patterns DS that are arranged in the first direction D1.

Referring back to FIGS. 12 to 15, upper conductive lines 260 may be formed on the second interlayer dielectric layer 240 on the cell region CR, and second conductive contacts 250 may be formed in the second interlayer dielectric layer 240. The second conductive contacts 250 may penetrate the first and second interlayer dielectric layers 230 and 240 to come into connection with corresponding cell via contacts 200. The upper conductive lines 260 and the second conductive contacts 250 may be formed by, for example, a method the same as or substantially the same as that used for forming the second cell conductive lines 196 and the first conductive contacts 194. Except for mentioned above, a method of fabricating a semiconductor device according to the present embodiment is substantially the same as that discussed with reference to FIGS. 7A, 8A, 9A, 10A, 7B, 8B, 9B, and 10B.

Figure 20:
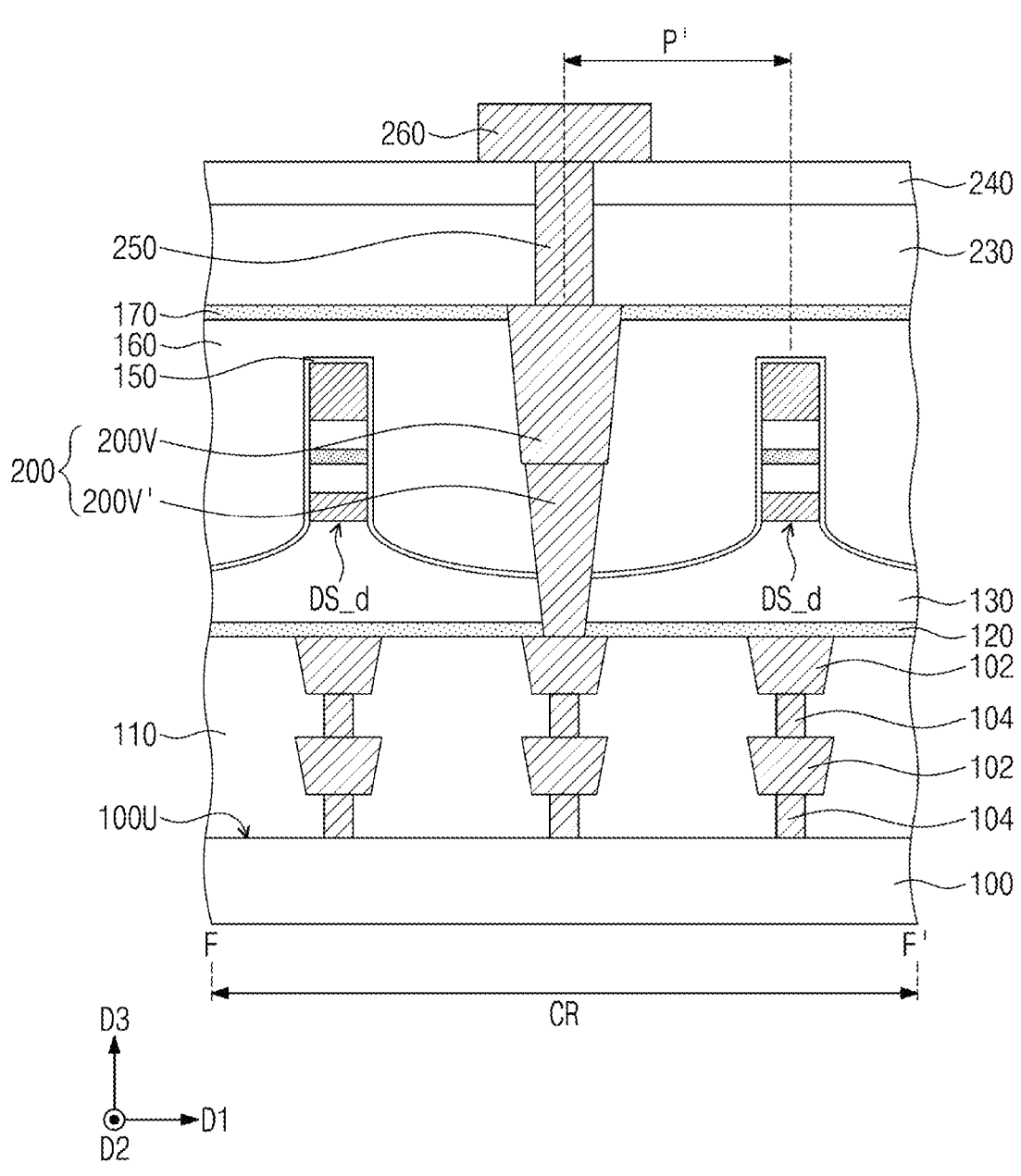
FIG. 20 illustrates a cross-sectional view taken along line F-F' of FIG. 12, showing a semiconductor device according to some embodiments of inventive concepts.

FIG. 20 illustrates a cross-sectional view taken along line F-F' of FIG. 12, showing a semiconductor device according to some embodiments of inventive concepts. For brevity of description, differences from the semiconductor device discussed with reference to FIG. 12 will be chiefly explained below. Referring to FIGS. 12 and 20, according to some embodiments, the cell dielectric pattern 182 may be omitted which is illustrated in FIGS. 14 and 15. In this case, each of the cell via contacts 200 may penetrate the upper dielectric layer 170, the cell dielectric layer 160, the capping dielectric layer 150, the second lower dielectric layer 130, and the first lower dielectric layer 120. The first vertical part 200V of each of the cell via contacts 200 may penetrate the upper dielectric layer 170 and an upper portion of the cell dielectric layer 160. The second vertical part 200V' of each of the cell via contacts 200 may extend toward the substrate 100. The second vertical part 200V' may penetrate a lower portion of the cell dielectric layer 160, the capping dielectric layer 150, the second lower dielectric layer 130, and the first lower dielectric layer 120, and may be connected to a corresponding one of the uppermost wiring lines 102. Except for mentioned above, a semiconductor device according to the present embodiment is substantially the same as that discussed with reference to FIGS. 12 to 15.

According to embodiments of inventive concepts, a semiconductor device may include cell via contacts that are spaced apart from each other in a first direction between first cell conductive lines, and may also include dummy data storage patterns that are spaced apart from each other in the first direction between the first cell conductive lines and are interposed between the cell via contacts.

As the dummy data storage patterns are disposed between the cell via contacts, it may not be required to form additional dummy data storage patterns on an area adjacent to the cell via contacts. There may thus be an increase in integration of data storage patterns, and as a result, there may be easiness in integration of the semiconductor device.

In addition, conductive mask patterns may be uniformly disposed on a cell region in an etching process for forming the data storage patterns and the dummy storage patterns. Therefore, an area where the cell via contacts are formed may be limited and/or prevented from being over-etched. Accordingly, the semiconductor device may improve in fabrication difficulty.

Moreover, upper conductive lines whose resistance is relative small may be connected through the cell via contacts to selection elements on a substrate, and may serve as word lines. Accordingly, there may be a reduction in resistance of the word lines included in a memory cell.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate;
a plurality of data storage patterns on the substrate and spaced apart from each other in a first direction and a second direction, the first direction and the second direction intersecting each other and being parallel to a top surface of the substrate;
a plurality of first cell conductive lines extending in the first direction and being spaced apart from each other in the second direction on the data storage patterns, each of the plurality of first cell conductive lines being connected to a corresponding column of data storage patterns that are spaced apart from each other in the first direction among the plurality of data storage patterns;
a plurality of cell via contacts spaced apart from each other in the first direction and disposed between a pair of the plurality of first cell conductive lines;
a plurality of dummy data storage patterns spaced apart from each other in the first direction and disposed between the pair of the plurality of first cell conductive lines, the plurality of dummy data storage patterns being interposed between the plurality of cell via contacts; and
a plurality of upper conductive lines on the plurality of cell via contacts and electrically connected to the plurality of cell via contacts, respectively.

2. The semiconductor device of claim 1, wherein the plurality of cell via contacts and the plurality of dummy data storage patterns are alternately disposed along the first direction between the pair of the plurality of first cell conductive lines.

3. The semiconductor device of claim 1, further comprising:
a plurality of first conductive contacts on the plurality of cell via contacts, respectively, wherein
each of the plurality of upper conductive lines is electrically connected through a corresponding one of the plurality of first conductive contacts to a corresponding one of the plurality of cell via contacts.

4. The semiconductor device of claim 1, wherein
top surfaces of the plurality of cell via contacts are at same heights as top surfaces of the plurality of first cell conductive lines.

5. The semiconductor device of claim 1, wherein a material of the plurality of cell via contacts is same as a material of the plurality of the first cell conductive lines.

6. The semiconductor device of claim 1, wherein the plurality of dummy data storage patterns are offset in the first direction from the corresponding column of data storage patterns.

7. The semiconductor device of claim 6, wherein the plurality of cell via contacts are aligned in the second direction with a corresponding row of data storage patterns that are arranged in the second direction among the plurality of data storage patterns.

8. The semiconductor device of claim 1, wherein the plurality of cell via contacts are offset in the first direction from the corresponding column of data storage patterns.

9. The semiconductor device of claim 8, wherein each of the plurality of dummy storage patterns is aligned in the second direction with a corresponding row of data storage patterns that are arranged in the second direction among the plurality of data storage patterns.

10. The semiconductor device of claim 9, wherein
the corresponding column data storage patterns are spaced apart from each other at a first pitch along the first direction,
the plurality of cell via contacts and the plurality of dummy data storage pattern are spaced apart from each other at a second pitch along the first direction, and
the second pitch is less than the first pitch.

11. The semiconductor device of claim 10, wherein the second pitch is half the first pitch.

12. The semiconductor device of claim 1, further comprising:
a wiring structure between the substrate and the plurality of data storage patterns; and
a plurality of lower electrode contacts between the wiring structure and the plurality of data storage patterns, wherein
the plurality of lower electrode contacts are connected to corresponding data storage patterns among the plurality of data storage patterns,
the plurality of lower electrode contacts are connected to corresponding uppermost conductive lines among uppermost conductive lines of the wiring structure, respectively, and
the plurality of cell via contacts are connected to other corresponding uppermost conductive lines among the uppermost conductive lines of the wiring structure.

13. The semiconductor device of claim 12, further comprising:
a wiring dielectric layer on the substrate and covering the wiring structure;
a first lower dielectric layer on the wiring dielectric layer; and
a second lower dielectric layer on the first lower dielectric layer and covering the plurality of lower electrode contacts, wherein
the plurality of data storage patterns are on the second lower dielectric layer,
the plurality of lower electrode contacts penetrate the second lower dielectric layer and the first lower dielectric layer to connect with the corresponding uppermost conductive lines of the wiring structure,
the second lower dielectric layer has a recessed part between the plurality of data storage patterns, and
a height of a lowermost surface of the recessed part of the second lower dielectric layer is lower than a height of top surfaces the plurality of lower electrode contacts.

14. The semiconductor device of claim 13, wherein
the substrate includes a cell region and a peripheral region,
the plurality of lower electrode contacts, the plurality of data storage patterns, the plurality of first cell conductive lines, the plurality of dummy data storage patterns, and the plurality of upper conductive lines are on the cell region,
the wiring dielectric layer, the first lower dielectric layer, and the second lower dielectric layer cover the cell region and the peripheral region, and a top surface of the second lower dielectric layer on the peripheral region is lower than a the lowermost surface of the recessed part of the second lower interlayer dielectric layer.

15. The semiconductor device of claim 13, further comprising:

a cell dielectric layer on the lower dielectric layer, wherein the cell dielectric layer covers the plurality of data storage patterns and the plurality of dummy data storage patterns, and the plurality of cell via contacts penetrate the cell dielectric layer and connect to the other corresponding uppermost conductive lines of the wiring structure.

16. The semiconductor device of claim 1, further comprising:

a plurality of second cell conductive lines extending in the first direction and spaced apart from each other in the second direction on the plurality of first cell conductive lines; and a plurality of first conductive contacts between the plurality of first cell conductive lines and the plurality of second cell conductive lines, wherein the plurality of second cell conductive lines are correspondingly electrically connected through the plurality of first conductive contacts to the plurality of first cell conductive lines.

17. The semiconductor device of claim 16, wherein heights of the plurality of upper conductive lines are higher than heights of the plurality of second cell conductive lines over the substrate.

18. A semiconductor device, comprising:

a substrate;

a plurality of data storage patterns on the substrate and spaced apart from each other in a first direction and a second direction, the first direction and the second direction intersecting each other and being parallel to a top surface of the substrate;

a plurality of first cell conductive lines extending in the first direction and being spaced apart from each other in the second direction on the data storage patterns, each of the plurality of first cell conductive lines being connected to a corresponding column of data storage patterns that are spaced apart from each other in the first direction among the data storage patterns;

a plurality of cell via contacts spaced apart from each other in the first direction and disposed between a pair of the plurality of first cell conductive lines, the plurality of cell via contacts being aligned in the second direction with the corresponding column of data storage patterns; and a plurality of dummy data storage patterns spaced apart from each other in the first direction and disposed between the pair of the plurality of first cell conductive lines, the plurality of dummy data storage patterns being disposed between the plurality of cell via contacts.

19. The semiconductor device of claim 18, further comprising:

a plurality of first conductive contacts on the plurality of cell via contacts, respectively; and a plurality of upper conductive lines on and correspondingly connected to the plurality of first conductive contacts, wherein the plurality of upper conductive lines are electrically connected to the plurality of cell via contacts through the plurality of first conductive contacts, respectively.

20. The semiconductor device of claim 18, wherein the plurality of dummy data storage patterns are offset in the first direction from the corresponding column of data storage patterns.

* * * * *